(12) United States Patent
Ahmed Kathawala et al.

(10) Patent No.: US 7,746,705 B2
(45) Date of Patent: Jun. 29, 2010

(54) SELECTIVE APPLICATION OF WORD LINE BIAS TO MINIMIZE FRINGE EFFECTS IN ELECTROMAGNETIC FIELDS DURING ERASE OF NONVOLATILE MEMORY

(75) Inventors: Gulzar Ahmed Kathawala, Santa Clara, CA (US); Wei Zheng, Santa Clara, CA (US); Zhizheng Liu, San Jose, CA (US); Sung-Yong Chung, Santa Clara, CA (US); Timothy Thurgate, Sunnyvale, CA (US); Kuo-Tung Chang, Saratoga, CA (US); Sheung-Hee Park, Pleasanton, CA (US); Gabrielle Wing Han Leung, Palo Alto, CA (US)

(73) Assignee: Spansion LLC, Sunnyvale, CA (US)

( * ) Notice: Subject to any disclaimer, the term of this patent is extended or adjusted under 35 U.S.C. 154(b) by 196 days.

(21) Appl. No.: 11/953,689

(22) Filed: Dec. 10, 2007

(65) Prior Publication Data
US 2009/0147589 A1 Jun. 11, 2009

(51) Int. Cl.
*G11C 16/04* (2006.01)
(52) U.S. Cl. .............. 365/185.29; 365/185.17; 365/185.18; 365/185.33; 365/185.11
(58) Field of Classification Search ............ 365/185.29, 365/185.17–185.18, 185.33, 185.11, 185.03
See application file for complete search history.

(56) References Cited

U.S. PATENT DOCUMENTS

| | | | | |
|---|---|---|---|---|
| 6,345,000 B1 * | 2/2002 | Wong et al. | ............ | 365/185.29 |
| 6,885,590 B1 * | 4/2005 | Zheng et al. | ........... | 365/185.29 |
| 7,133,317 B2 * | 11/2006 | Liao et al. | .............. | 365/185.28 |
| 7,466,589 B2 * | 12/2008 | Wu | ........................ | 365/185.17 |
| 7,539,066 B2 * | 5/2009 | Aritome | ................ | 365/185.29 |

\* cited by examiner

*Primary Examiner*—David Lam
(74) *Attorney, Agent, or Firm*—Turocy & Watson, LLP

(57) ABSTRACT

A memory device comprising an optimization component that facilitates erasing memory cells in a substantially homogeneous electromagnetic field and methods that facilitate erasing memory cells in a substantially homogeneous electromagnetic field are presented. The optimization component facilitates selecting a subset of memory cells to be erased at the same time, such that a memory cell in the subset of memory cells has two neighbor memory cells adjacent thereto that are in the subset of memory, or one neighbor memory cell adjacent thereto when the memory cell is an end-row memory cell. The optimization component facilitates performing a Fowler-Nordheim channel erase to erase the subset of memory cells, and a predetermined voltage potential associated with an erase command is applied to each cell of the subset of memory cells to facilitate reducing fringing effect associated with the electromagnetic fields applied to the cells during the erase.

13 Claims, 14 Drawing Sheets

SELECTIVE APPLICATION OF WORD LINE BIAS TO MINIMIZE FRINGE EFFECTS IN ELECTROMAGNETIC FIELDS DURING ERASE OF NONVOLATILE MEMORY

TECHNICAL FIELD

The subject innovation relates generally to memory systems, and in particular, to systems and/or methodologies that can facilitate efficient erasing of data in memory devices.

BACKGROUND

The volume, use, and complexity of computers and electronic devices are continually increasing. Computers consistently become more powerful and new and improved electronic devices are continually being developed (e.g., digital audio players, video players). Additionally, the growth and use of digital media (e.g., digital audio, video, images, and the like) have further pushed development of these devices. Such growth and development has vastly increased the amount of information desired/required to be stored and maintained for computer and electronic devices.

Generally, information can be stored and maintained in one or more of a number of types of storage devices, such as memory devices. Memory devices can be subdivided into volatile and non-volatile types. Volatile memory devices generally lose their information if they lose power and typically require periodic refresh cycles to maintain their information. Volatile memory devices include, for example, random access memory (RAM), dynamic RAM (DRAM), static RAM (SRAM), and the like. Non-volatile memory devices can maintain their information whether or not power is maintained to the memory devices. Non-volatile memory devices include, but are not limited to, flash memory, read only memory (ROM), programmable ROM (PROM), erasable PROM (EPROM), electrically erasable PROM (EEPROM), non-volatile RAM, and the like.

The use of portable computer and electronic devices has greatly increased demand for memory devices. Digital cameras, digital audio players, personal digital assistants, and the like, generally seek to employ large capacity memory devices (e.g., flash memory, smart media, compact flash, . . . ). The increased demand for information storage can be commensurate with memory devices having an ever-increasing storage capacity (e.g., increase storage per die or chip). For example, a postage-stamp-sized piece of silicon can contain tens of millions of transistors, with each transistor as small as a few hundred nanometers.

The memory cells of a memory device typically can be arranged in a memory array. A memory cell can be placed at each intersecting row and column in the array. Typically, a particular memory cell can be accessed by activating its row and then reading or writing the state of its column. Memory sizes can be defined by the row and column architecture. For example, a 1024 row by 1024 column memory array can define a memory device having one megabit of memory cells. The array rows can be referred to as word lines and the array columns can be referred to as bit lines.

In memory cells, one or more bits of data can be stored in and read from respective memory cells. The erase, program, and read operations to access memory cells and data associated therewith can be commonly performed by application of appropriate voltages to certain terminals of the memory cells. In an erase or write operation the voltages can be applied so as to cause a charge to be removed or stored in a charge storage layer of the memory cell.

The trend in semiconductor memory devices has been toward higher circuit density with higher numbers of bit cells per device, lower operating voltages, and higher access speeds. To achieve these high densities there have been, and continue to be, efforts toward scaling down device dimensions (e.g., at sub-micron levels). However, as the desired scaling down of device dimensions occur, certain undesirable electromagnetic field effects can be increasingly problematic. It is desirable to scale down the size of memory devices while reducing or minimizing certain undesirable electromagnetic field effects and maintaining and/or improving the functionality of such memory devices.

SUMMARY

The following presents a simplified summary of the innovation in order to provide a basic understanding of some aspects of the innovation. This summary is not an extensive overview of the innovation. It is intended to neither identify key or critical elements of the innovation nor delineate the scope of the innovation. Its sole purpose is to present some concepts of the innovation in a simplified form as a prelude to the more detailed description that is presented later.

In accordance with one aspect of the disclosed subject matter, a memory device (e.g., flash memory) can be comprised of a plurality of memory locations (e.g., memory cells) in which data can be stored. In an aspect, the memory cells can each be comprised of a top oxide layer, a top silicon-rich silicon nitrite layer, a polysilicon layer, a bottom silicon-rich silicon nitrite layer and a bottom oxide layer (ORPRO) that can facilitate trapping and storing of electron charges in the polysilicon layer, where the amount of stored charge in the cell can represent and correspond to a data value of the data being written to the memory cell. The memory device can include a predetermined number of sectors that can each include a subset of memory cells. The memory cells can be accessed (e.g., read, write, erase) by applying predetermined voltage levels related to the particular operation to respective word lines that can be associated therewith and/or predetermined voltage levels to a substrate associated therewith.

In accordance with one aspect of the disclosed subject matter, an optimization component can facilitate erasing memory cells in the memory device. The optimization component can facilitate performing erase operations to erase data (e.g., remove electron charges) from memory cells, where the memory cells can be erased by employing a Fowler-Nordheim (FN) erase scheme. In another aspect, the optimization component can facilitate selecting a subset of memory cells in a sector or block of the memory device that can be erased at the same time or substantially the same time. The memory cells are selected to be in the subset of memory cells such that each memory cell has two neighbor memory cells adjacent (e.g., on the side of) to such memory cell, except where such memory cell is at the end of a row of memory cells or the end of the subset of memory cells, where each end-row memory cell or end-of-subset memory cell can have one neighbor memory cell adjacent thereto. An predetermined voltage potential can be applied to each memory cell of the subset of memory cells at the same or substantially the same time so that substantially uniform electromagnetic fields (e.g., substantially vertical electromagnetic field lines) can be generated and applied to each memory cell of the subset to facilitate improving erase of the memory cells, as compared to conventional memory devices.

A memory device employing such optimization component can thereby improve erases of memory cells in the memory device, as compared to conventional memory devices, such that there can be a reduction in undesirable fringing effects that can distort electromagnetic field lines or cause the electromagnetic field lines to be less vertical; the erase speed of the memory device can be increased; there can be a reduction of electromagnetic field in the top oxide layer of ORPRO memory cells; there can be a reduction in a back-tunneling current in ORPRO memory cells; there can be a reduction in erase saturation in memory cells; and/or there can be an improved erase window in the memory cells.

To the accomplishment of the foregoing and related ends, the innovation, then, comprises the features hereinafter fully described and particularly pointed out in the claims. The following description and the annexed drawings set forth in detail certain illustrative embodiments of the innovation. These embodiments can be indicative, however, of but a few of the various ways in which the principles of the innovation may be employed. Other objects, advantages, and novel features of the innovation will become apparent from the following detailed description of the innovation when considered in conjunction with the drawings.

DETAILED DESCRIPTION

Figure 1:
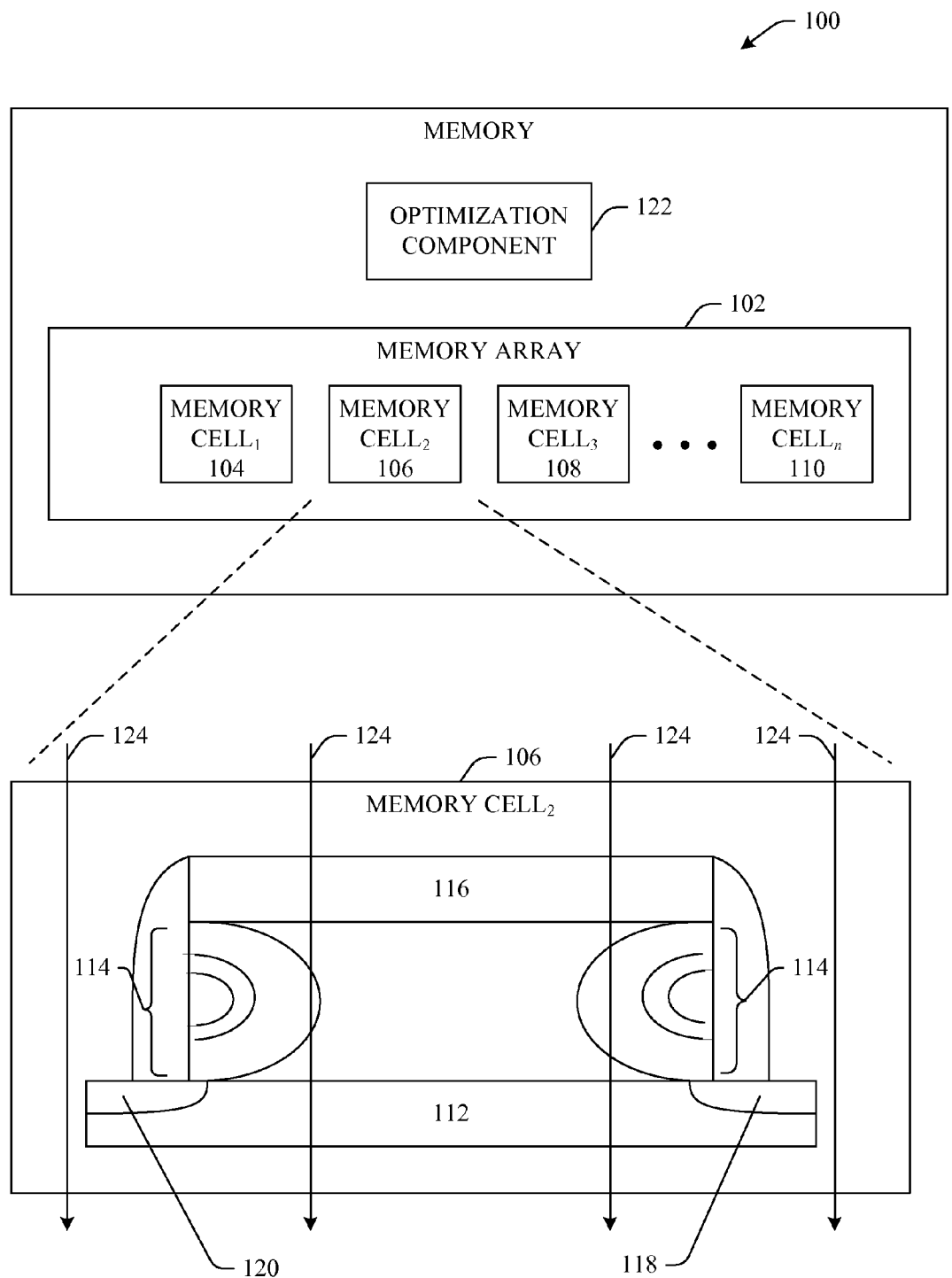
FIG. 1 illustrates a memory device that facilitates an erase of data in accordance with an aspect of the disclosed subject matter.

The disclosed subject matter is described with reference to the drawings, wherein like reference numerals are used to refer to like elements throughout. In the following description, for purposes of explanation, numerous specific details are set forth in order to provide a thorough understanding of the subject innovation. It may be evident, however, that the disclosed subject matter may be practiced without these specific details. In other instances, well-known structures and devices are shown in block diagram form in order to facilitate describing the subject innovation.

Memory devices are continually trending towards higher density where components therein are situated closer together to facilitate providing increased memory capacity and/or efficiency. However, as the desired scaling down of device dimensions occur, certain undesirable electromagnetic field effects can be increasingly problematic and can negatively impact the performance of a memory device. For instance, during erase operations, an electromagnetic field can be generated to facilitate erasing the memory cell. The electromagnetic field lines can be subject to undesirable fringing effects that can cause the electromagnetic field lines to be distorted or less than substantially vertical, which can negatively impact the erase of the memory cell, as, for example, this can result in a reduction in the erase speed and/or a reduction in the size of the erase window. It is desirable to improve the functionality of memory devices, including improving the speed in executing erase operations, and improving the erase window associated with memory cells in a memory device.

Systems and/or methods that facilitate accessing (e.g., erasing) memory locations in a memory device are presented as well as memory devices that facilitate improved access. An optimization component can be employed to facilitate the performance of erase operations in a nonvolatile memory (e.g., flash memory). In one aspect, the optimization component can facilitate employing a Fowler-Nordheim (FN) erase scheme to erase memory locations (e.g., memory cells) in the memory. During an erase operation, the optimization component can facilitate selection of memory cells that are adjacent to each other and an erase of such cells concurrently in order to minimize and/or reduce electromagnetic fringe effects thereby improving the erase performance. The optimization component can facilitate applying a predetermined word line voltage to word lines associated with each of the adjacent memory cells and/or a predetermined voltage to a substrate associated therewith to facilitate erasure of the memory cells.

Turning to the figures, FIG. 1 illustrates a memory device 100 that can facilitate storage of data in accordance with an aspect of the disclosed subject matter. Memory device 100 can be or can include a nonvolatile memory, such as, for example, flash memory (e.g., single-bit flash memory, multi-bit flash memory), mask-programmed ROM, programmable ROM (PROM), Erasable PROM (EPROM), Ultra Violet (UV)-erase EPROM, one-time programmable ROM, electrically erasable PROM (EEPROM), and nonvolatile random access memory (NVRAM) (e.g., ferroelectric random access memory (FeRAM)).

Memory device 100 can include a memory array(s) 102 that can be comprised of a plurality of memory cells, as depicted by memory cell$_1$ 104, memory cell$_2$ 106, memory cell$_3$ 108, and through memory cell$_n$ 110, where each memory cell 104, 106, 108, 110 can be substantially identical. Each memory cell 104, 106, 108, 110 can store one or more bits of data. Operations, including program operations, read operations, and/or erase operations, can be performed on the memory cells 104, 106, 108, 110 to correspondingly write data to respective cells, read data from respective cells, and/or erase data from respective cells 104, 106, 108, 110, for example.

Each memory cell 104, 106, 108, 110 can be formed on or associated with a substrate component 112 that can be a semiconductor substrate, for example. Each memory cell 104, 106, 108, 110 can also include one or more charge storage components 114 that can trap and/or store charge. The value of the bit(s) of data stored in a memory cell can be based in part on the amount of charge stored in a charge storage component(s) 114 of the memory cell. Two charge storage components 114 are depicted in memory cell$_2$ 106 in FIG. 1, for example, although it is to be appreciated that such number of charge storage components 114 is just one example, and the subject innovation contemplates that there can be less than two charge storage components 114 or more than two charge storage components 114 in accordance with an aspect of the subject innovation.

Each memory cell 104, 106, 108, 110 can also contain a gate component 116 that can facilitate storage or trapping of charge in the charge storage component(s) 116. Each memory cell 104, 106, 108, 110 can include a source 118 and a drain 120, which can facilitate storage or trapping of charge in the charge storage component(s) 114. For example, respective predetermined voltages can be applied to the gate component 116, source 118, and/or drain 120 based in part on the operation (e.g., write, read, erase) being performed on the particular memory cell(s) to store charge in the charge storage component(s) 114 during a write operation, measure or evaluate charge stored in the charge storage component(s) 114 during a read operation, and/or remove charge from the charge storage component(s) 114 during an erase operation. It is to be appreciated that where there is more than one charge storage component 114, the source 118 can also act as a drain 120, and the drain 120 can also act as a source 118, where their respective roles as source or drain can be determined based in which charge storage component 114 is being accessed during an operation.

In one aspect, each memory cell 104, 106, 108, 110 can have an oxide/silicon-rich silicon nitride/polysilicon/silicon-rich silicon nitride/oxide (ORPRO) layer configuration. The charge storage component(s) 114 can each be comprised of the ORPRO layers, where the charge can be trapped in the respective polysilicon layers of each charge storage component 114.

When erasing memory cells (e.g., 104, 106, 108, 110) in a memory array 102 in a flash memory device (e.g., 100), typically, an entire sector or block or memory cells is erased at substantially the same time, due to flash memory characteristics. Conventionally, when a group (e.g., sector, block) of memory cells (e.g., 104, 106, 108, 110) is being erased, erase schemes can be employed to effectuate an erase of the group of memory cells. For example, with certain flash memory configurations, applying a voltage to all word lines (WLs) of memory cells in a sector can result in an undesirable current× resistance (IR) drop that can negatively impact the erase of the memory cells. To limit the amount of current generated at a given time and thus limit the IR drop, the memory cells can be erased by applying the predetermined voltage to the WLs of the memory cells in an even-odd manner; that is, the predetermined voltage can first be applied to the even numbered WLs to erase the memory cells associated with the even-numbered WLs, and after those memory cells are erased, the predetermined voltage can be applied to the odd-numbered WLs to erase the memory cells associated therewith.

Erasure of multi-bit memory cells can be performed using conventional erase techniques, such as "hot hole injection" or a channel erase scheme, for example. During "hot hole injection", which is also referred to as band-to-band (BTB) hot hole injection, respective predetermined voltages can be supplied to the gate component 116 and the drain 120, and the source 118 can be floated or grounded, to erase a charge storage component 114 of the memory cell. Likewise, to erase the other charge storage component 114 (e.g., complementary bit(s)) of the memory cell, respective predetermined voltages can be applied to the gate component 116 and the source 118 (now acting as a drain), and the drain 120 (now acting as a source) can be floated or grounded.

During application of the respective predetermined voltages, a BTB tunnel current can be generated under the gate component 116. This can result in holes being generated and can accelerate from the n-type drain 120 into the substrate component 112, which can be a p-type substrate. However, these holes can cause damage to certain layers (e.g., bottom oxide layer nearest to the substrate 112) of the memory cell, which can cause the memory cell to degrade as the number of program/erase cycles increase.

Another erase technique is the channel erase, which is also known as an FN erase or FN channel erase. Typically, during a channel erase, electromagnetic fields can be generated based in part on the respective predetermined voltage levels applied to the gate component 116, source 118, drain 120, and/or substrate component 112. The electromagnetic fields facilitate causing charge stored in a charge storage component(s) 114 to be pushed or driven out of the charge storage component 114 (e.g., charge storing polysilicon layer), and, when sufficient charge is removed from the charge storage component(s) 114, the memory cell can be in an erased state. To efficiently erase the memory cells, it is desirable to have the electromagnetic fields be vertical, or substantially vertical, with respect to the memory cell being erased.

However, conventionally, during a channel erase, when employing, for example, the even-odd word line selection technique or certain other techniques to erase memory cells in a sector, the electromagnetic fields can be negatively impacted resulting in fringing effects that cause the electromagnetic fields to distort and become less vertical with respect to the memory cells. This fringing effect can result in a less efficient erase of the memory cells. For example, during the channel erase, when the electromagnetic fields are not substantially vertical, electrons in the gate component 116, which can be an N+-type polysilicon gate or P+-type polysilicon gate, for example, can often move from the gate component 116 through the top oxide layer and can be trapped in the charge storage component(s) 114. As a result, the erase of the memory cell can be negatively impacted, as some of the electrons driven from the charge storage component(s) 114 can be replaced by electrons moving from the gate component 116 resulting in a lower net amount of charge being removed from the charge storage component(s) 114 and/or a net increase in the amount of time to erase the memory cell. This can also result in a reduced window, which can be the voltage range in which the memory cell can be read as being an erased memory cell.

When the memory cells are being erased in a manner such that a memory cell being erased (e.g., having voltage applied to its associated word line) is neighbored by memory cells on each side of it that are not being erased at that time, for example, with the even-odd word line selection technique, the neighboring memory cells that are not currently being erased can have a significantly lower voltage potential than the memory cell being erased. The undesirable fringing effect can be caused, in significant part, by the voltage potential, which is applied at the word line of the memory cell being erased, trying to move towards the lower potential areas of the memory cells that neighbor the memory cell being erased.

In accordance with an aspect of the disclosed subject matter, memory device 100 can contain an optimization component 122 that can facilitate erasing memory cells (e.g., 104, 106, 108, 110) in the memory array 102 in an efficient manner, in part, by reducing and/or minimizing the undesirable fringing effects associated with the electromagnetic fields so that the electromagnetic fields can be vertical, or substantially vertical, as compared to memory erase performance of conventional memory devices.

In one aspect, to facilitate an efficient erase of desired memory cells, during an erase (e.g., FN channel erase), the optimization component 122 can facilitate selection of memory cells to be erased such that a memory cell (e.g., 106) being erased at a given time will have the neighbor memory cells (e.g., 104 and 108) that are adjacent to such memory cell being erased at the same time. That is, the predetermined voltage potential being applied to such memory cell by application of respective voltage levels to the associated word line and/or substrate (as well as the associated source and/or drain) can also be applied to the neighbor memory cells adjacent to (e.g., on each side of) such memory cell. As a result, the voltage potential difference between the memory cell and its neighbor memory cells can be virtually eliminated, except for a possible voltage potential difference resulting from the spaces between the memory cell and the neighbor memory cells, which can have relatively minimal impact. This virtual elimination of the voltage potential difference between the memory cell and neighbor memory cells being erased can result in reducing and/or minimizing the undesirable fringing effect and as a result, the electromagnetic field lines 124 can be vertical, or substantially vertical, with respect to the memory cell (e.g., 106) during the erase of such cell, which can thereby result in an improved erase of the memory cell, as compared to conventional memory devices.

For example, the subject innovation can improve erase speed and/or reduce and/or minimize erase saturation, as compared to conventional memory devices. Reducing and/or minimizing the undesirable fringing effect of electromagnetic fields during an erase can result reducing and/or minimizing the electromagnetic field in the top oxide layer of the memory cell and can reduce back-tunneling from the gate component 116, which can thereby decrease erase saturation, as the reduced fringing effect can result in less electrons moving from the gate component 116 and becoming trapped in the charge storage component(s) 114 and replacing electrons that are driven out of the charge storage component(s) 114 to the substrate 112, which can thereby result in an improved erase speed. Further, the reduction in fringe effect can facilitate erasing the memory cells to a significantly lower threshold voltage level, which can thereby maintain and/or improve the window (e.g., the voltage range in which a memory cell can be read as an erased cell), as compared to conventional memory devices.

In accordance with another aspect of the disclosed subject matter, the memory device 100 can be a flash memory device that can have a memory array 102 that can have a plurality of memory cells (e.g., 104, 106, 108, 110) where the plurality of memory cells (e.g., 104, 106, 108, 110) can be situated or grouped in sectors (or blocks) (not shown) that can each contain subset of the plurality of the memory cells (e.g., 104, 106, 108, 110) of the memory array 102. Each memory cell (e.g., 104) in the memory device 100 can have an ORPRO configuration. During erase operations associated with memory cells (e.g., 104, 106, 108, 110) in the memory device 100, the FN channel erase scheme can be employed to erase the desired memory cells (e.g., 104, 106, 108, 110).

In an aspect, during an erase operation to erase a sector of the memory device 100, the optimization component 122 can facilitate selecting all of the memory cells in the sector to be erased via the FN channel erase, where, by selecting all of the memory cells in the sector, each memory cell in the sector can have a neighbor memory cell on each side of the memory cell in their respective row in the array 102 that is selected for erase at the same time, or substantially the same time, except for memory cells that are at the end of a row in the sector in the array 102, which can each have one neighbor cell adjacent to such end-row memory cell, where the end-row memory cell and its neighbor memory cell can be erased at the same or substantially the same time.

As all memory cells in the sector are selected, during the erase, a predetermined voltage level (e.g., negative bias) can be applied to the respective WLs (e.g., 256 WLs, 512 WLs, etc.) of all memory cells in the sector and/or a respective predetermined voltage level (e.g., positive bias) can be applied to the substrate 112 associated with the memory cells resulting in a desired negative voltage potential (e.g., high negative potential, such as −18 volts) being applied to each of the memory cells in the sector to facilitate erasing such memory cells. Since each memory cell in the sector can have two adjacent neighbor cells, where all three cells can have the same or substantially the same voltage potential applied thereto (except the end-row memory cells, which can have one neighbor memory cell adjacent thereto), the undesired fringe effect can be reduced and/or minimized with respect to the electromagnetic fields generated as a result of the voltage potential applied to the memory cells in the sector, so that the electromagnetic fields can be substantially vertical with respect to each of the memory cells. As a result, the erase of the memory cells can be improved (e.g., increased erase speed, lower erase threshold voltage, reduced back-tunneling current, etc.) as compared to memory erases in conventional memory devices.

In accordance with one embodiment, performing an FN channel erase on a memory cell that has two neighbor memory cells adjacent thereto, where each cell has the same voltage potential applied, can result in an improved erase threshold voltage and thereby an improved window. For example, in this embodiment, the erase window associated with the memory cell can range from approximately 0.3 volts to approximately 2.5 volts, while conventionally the erase window of a memory cell can range from approximately 0.8 volts to approximately 2.5 volts. Thus, this embodiment can improve the erase window of the memory cell by approximately 0.5 volts over conventional memory devices.

It is to be appreciated that the end-row memory cell having only one neighbor memory cell adjacent thereto can still have an improved erase, when the end-row memory cell and its neighbor memory cell have the same or substantially the same voltage potential applied during the FN channel erase, although the electromagnetic fields associated with the end-row memory cell can still have some fringe effect due to the lower voltage potential on the side of the end-row memory cell that does not have a neighbor memory cell adjacent thereto.

In accordance with one embodiment, a memory device 100 can be a flash memory device with an ORPRO configuration that can have a plurality of sectors in a memory array 102. Each sector can include a plurality of memory cells (e.g., 104). There can be 512 WLs per sector that can be respectively associated with memory cells in the sector. During an FN channel erase operation, the optimization component 122 can facilitate selecting all 512 WLs in the sector to select all of the associated memory cells so that the memory cells can be erased at the same time or substantially the same time. Each memory cell can have two neighbor memory cells adjacent to each side of such memory cell (except for the end-row memory cells which can have one neighbor cell adjacent thereto), where the memory cells and neighbor cells can each have the same or similar voltage potential applied to erase the cells while reducing and/or minimizing fringe effects with respect to the electromagnetic fields.

For example, −8 volts can be applied to the WLs associated with the memory cells and +10 volts can be applied to the substrate to yield a net voltage potential of −18 volts that can act on the memory cells to facilitate driving electrons out of the charge storage component(s) 114 and into the substrate 112. It is to be appreciated that the −18 volt potential is an example only, and the subject innovation is not so limited, as the subject innovation contemplates that virtually any voltage potential (e.g., −12 volt potential, −15 volt potential, etc.) that can result in an erase of the memory cells can be employed, as the erase voltage potential can vary based in part on the characteristics of the memory device.

In another aspect, during the erase operation to erase a sector of the memory device 100, the optimization component 122 can facilitate selecting a subset of memory cells in a sector in the memory array 102 in the memory device 100, where each of the memory cells in the subset of memory cells has a neighbor memory cell on each side that is part of the subset of memory cells, except for an end-row memory cell(s) or a memory cell(s) that is at the end of the subset of the memory cells, which each end-row memory cell and/or end-of-subset memory cell can have one neighbor memory cell that is also part of the subset of memory cells.

During the FN channel erase, a predetermined voltage level (e.g., negative bias) can be applied to the respective WLs of each of the memory cells in the subset of memory cells and/or a respective predetermined voltage level (e.g., positive bias) can be applied to the substrate 112 associated with the subset of memory cells resulting in a desired voltage potential being applied to each of the memory cells in the subset of memory cells to facilitate erasing such memory cells. Since each memory cell in the subset of memory cells can have two adjacent neighbor cells, where all three cells can have the same or substantially the same voltage potential applied thereto (except the end-row memory cells or memory cell(s) at the end of the subset, which each can have one neighbor memory cell adjacent thereto), the undesired fringe effect can be reduced and/or minimized with respect to the electromagnetic fields generated as a result of the voltage potential applied to the memory cells in the subset of memory cells, so that the electromagnetic fields can be substantially vertical with respect to each of those memory cells.

As a result, the erase of the subset of memory cells can be improved (e.g., increased erase speed, lower erase threshold voltage, reduced back-tunneling current, etc.). Again, while the erase of the end-row memory cells (and the memory cells at the end of the subset) can be suboptimal due to only one neighbor memory cell, as compared to the memory cells that have two neighbor memory cells adjacent thereto, the end-row memory cells and/or end-of-subset memory cells can still realize erase improvement.

After the first subset of memory cells is erased, the optimization component 122 can facilitate selecting one or more other subsets of memory cells, where such memory cells can have at least one neighbor memory cell adjacent thereto that is part of the associated subset of memory cells.

In accordance with still another aspect, when less than the entire sector of memory cells is selected for erase (e.g., FN channel erase) at the same or substantially the same time, the optimization component 122 can facilitate selecting subsets of memory cells associated with the sector in the array 102 so as to maximize the number of memory cells in the sector that have two neighbor cells adjacent thereto where a memory cell and its two neighbor cells are grouped in the same subset that can be erased at the same or substantially the same time, or conversely, to minimize the number of memory cells in the sector that have only one neighbor cell adjacent thereto that are grouped in the same subset and erased at the same or substantially the same time.

In yet another aspect, the optimization component 122 can also facilitate selecting the subsets of memory cells so that no memory cell in the sector, or virtually no memory cells in the sector, are selected and subjected to an erase voltage potential when both of the neighbor cells (or one neighbor memory cell for an end-row memory cell) adjacent to a selected memory cell are not selected to be in the subset as the selected memory cell and/or erased at the same time or substantially the same time as the selected memory cell.

It is to be appreciated that memory device 100 can also employ volatile memory to facilitate data storage, where the volatile memory can include, for example, random access memory (RAM), such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), Rambus dynamic RAM (RDRAM), and the like.

Figure 2:
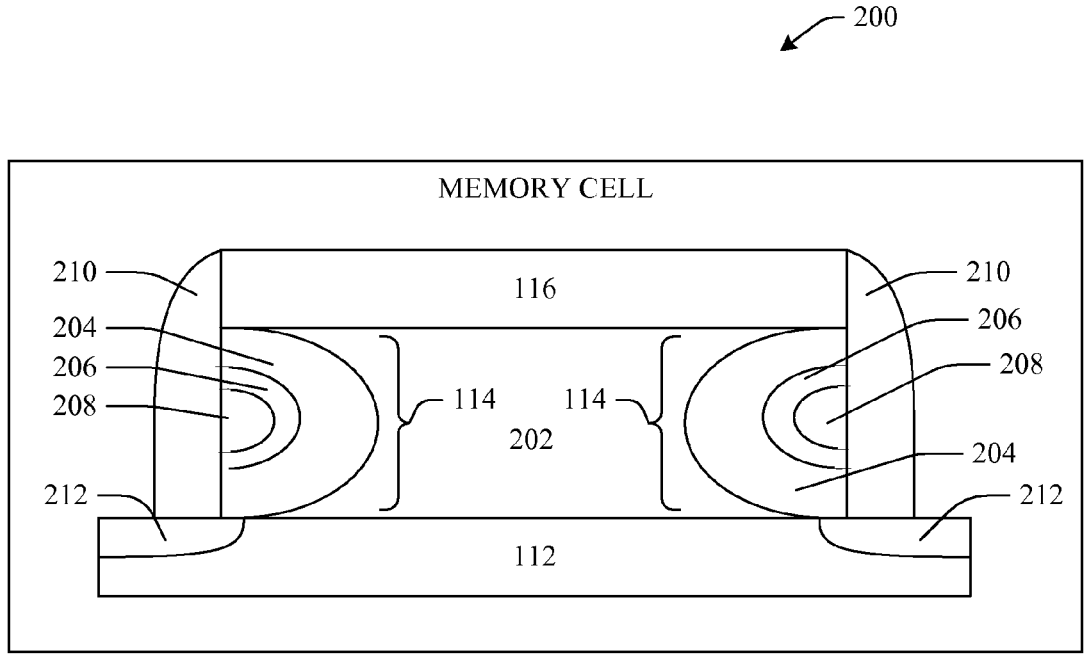
FIG. 2 depicts a memory cell associated with a memory device in accordance with an aspect of the disclosed subject matter.

Referring to FIG. 2, illustrated is a diagram of a memory cell 200 that can store data in accordance with an embodiment of the disclosed subject matter. In one aspect, the memory cell 200 can be one of a plurality of memory cells that can be included in a memory device (e.g., 100) (not shown), which can be a nonvolatile memory (e.g., flash memory, EEPROM, etc.). In accordance with another aspect, the memory cell 200 can store one or more bits of data. Operations, including program operations, read operations and/or erase operations, can be performed on the memory cell 200 to correspondingly write data to the cell 200, read data from the cell 200, and/or erase data from the cell 200, for example. In one embodiment, memory cell 200 can be the same or substantially the same as each of memory cells 104, 106, 108, and 110, as more fully described herein, for example, with regard to system 100. In yet another aspect, the memory cell 200 can be have an ORPRO configuration.

In accordance with an aspect, memory cell 200 can be formed as a stack that can be comprised of a gate component 116 that can be a layer formed from an N+-type polysilicon or P+-type polysilicon (e.g., P+ polycrystalline silicon) material. The gate component 116 can overly a gate oxide layer 202 that can be formed over a semiconductor substrate 112 and can have one or more storage components 114 (e.g., charge storage elements) in each undercut region. The illustrated storage components 114 can each include the silicon-rich silicon nitride layer 206 and/or the charge trapping layer 208. The charge trapping layer 208 can be made of polycrystalline silicon and can be surrounded by silicon-rich silicon nitride layer 206. One will appreciate that other materials, such as other nitrides, can alternatively be used in place of the silicon-rich silicon nitride. Overlaying the silicon-rich silicon nitride layer 206 in the illustration can be a tunnel oxide layer 204. Sidewall spacers 210 can be formed around the periphery of the gate component 116 and silicon oxide (not shown) can be filled in between the sidewall spacers 210. Bit lines 212 can act as a source (e.g., 118)/drain (e.g., 120) depending on the operation (e.g., read, programming) being performed and the charge storage element upon which the operation is being performed.

Figure 3:
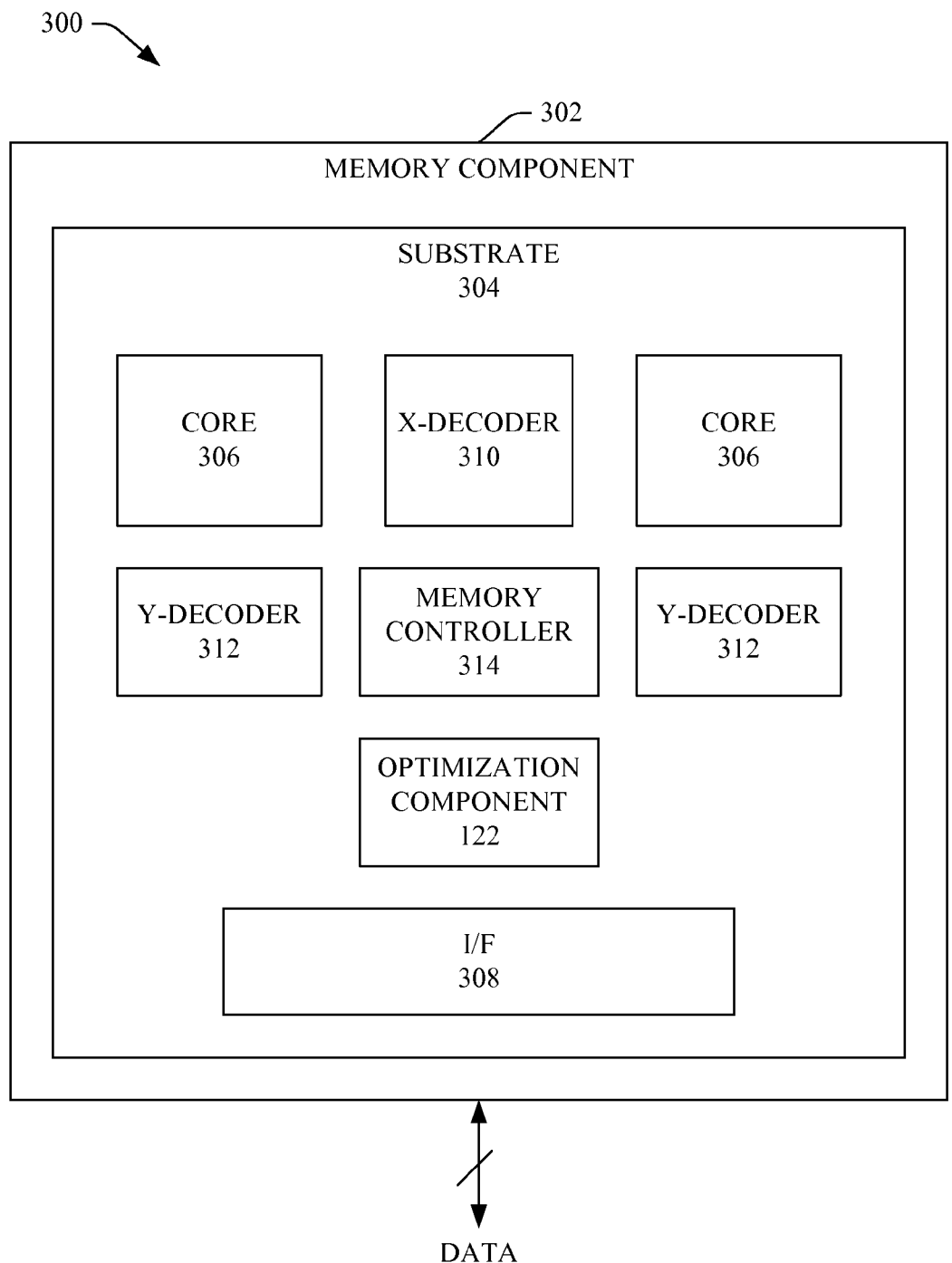
FIG. 3 illustrates a memory device that facilitates an erase of data in accordance with an aspect of the disclosed subject matter.

Turning to FIG. 3, illustrated is a block diagram of a memory device 300 that can facilitate storage of data in accordance with the disclosed subject matter. In accordance with an aspect, the memory device 300 can be or can include a memory component 302, which can be a nonvolatile memory, such as a flash memory (e.g., single-bit flash memory, multi-bit flash memory), that can be created on a semiconductor substrate 304 in which one or more core regions 306, which can be higher-density core regions, and one or more peripheral regions, which can be lower-density regions, can be formed. The high-density core regions 306 can include one or more M by N arrays of individually addressable, substantially identical memory cells (e.g., single-bit memory cells, multi-bit memory cells) (not shown). The memory cells in memory 302 can retain stored data even while disconnected from a power source.

The lower-density peripheral regions can typically include an interface component 308 (hereinafter also referred to as "I/F 308") and programming circuitry for selectively addressing the individual memory cells. The programming circuitry can be represented in part by and can include one or more x-decoders 310 and one or more y-decoders 312 that can cooperate with the I/F 308 for selectively connecting a source (e.g., 118), gate (e.g., gate component 116), and/or drain (e.g., 120) of selected addressed memory cells to predetermined voltages or impedances to effect designated operations (e.g., programming, reading, erasing) on the respective memory cells, and deriving necessary voltages to effect such operations. Further, the I/F 308 can include and/or provide various adapters, connectors, channels, communication paths, etc. to integrate the memory device 300 into virtually any operating and/or database system(s) and/or with another system(s). In addition, I/F 308 can provide various adapters, connectors, channels, communication paths, etc., that can provide for interaction and/or communication with other components, data, and the like, associated with the memory device 300.

Memory device 300 can also include a memory controller component 314 that can facilitate control of the flow of data to and from the memory component 302. In one aspect, the memory controller component 314, by itself or in conjunction with a host processor (not shown), can facilitate execution of operations (e.g., read, write, erase) associated with memory locations in the core(s) 304. In another aspect, the memory controller component 314 can facilitate verifying and/or maintaining the desired charge level(s) associated with data stored in the memory locations in the core(s) 304.

In still another aspect, the memory controller component 314 can operate in conjunction with the optimization component 122, which can be included in memory 300, to facilitate selecting a group(s) (e.g., subset(s)) of memory cells, where each memory cell of the group has two memory cells adjacent thereto that are in such group as well (except for an end-row memory cell or an end-of-subset memory cell, each of which can have one adjacent memory cell that is also in the group). The memory controller component 314 also can operate in conjunction with the optimization component 122 to facilitate supplying a desired predetermined voltage potential (e.g., negative bias to desired WLs, positive bias to the substrate 112, etc.) to facilitate erasing selected memory cells in the core 306 such that the predetermined voltage potential can be applied to a group of memory cells that are adjacent to each other in the sector of the memory array in a core 306 to erase the group of memory cells, which can facilitate reducing fringe effects on the electromagnetic fields associated with such memory cells that can be generated as a result of applying the predetermined threshold voltage to such cells, which can result in an improved erase of such cells.

It is to be appreciated and understood that the optimization component 122 can have the same or similar functionality as more fully described herein, for example, with regard to memory device 100. Also, it is to be appreciated and understood that, in accordance with one embodiment, the memory device 100, depicted in FIG. 1, can be and/or can include, and/or can have the same or similar functionality as, the memory device 300.

Figure 4A:
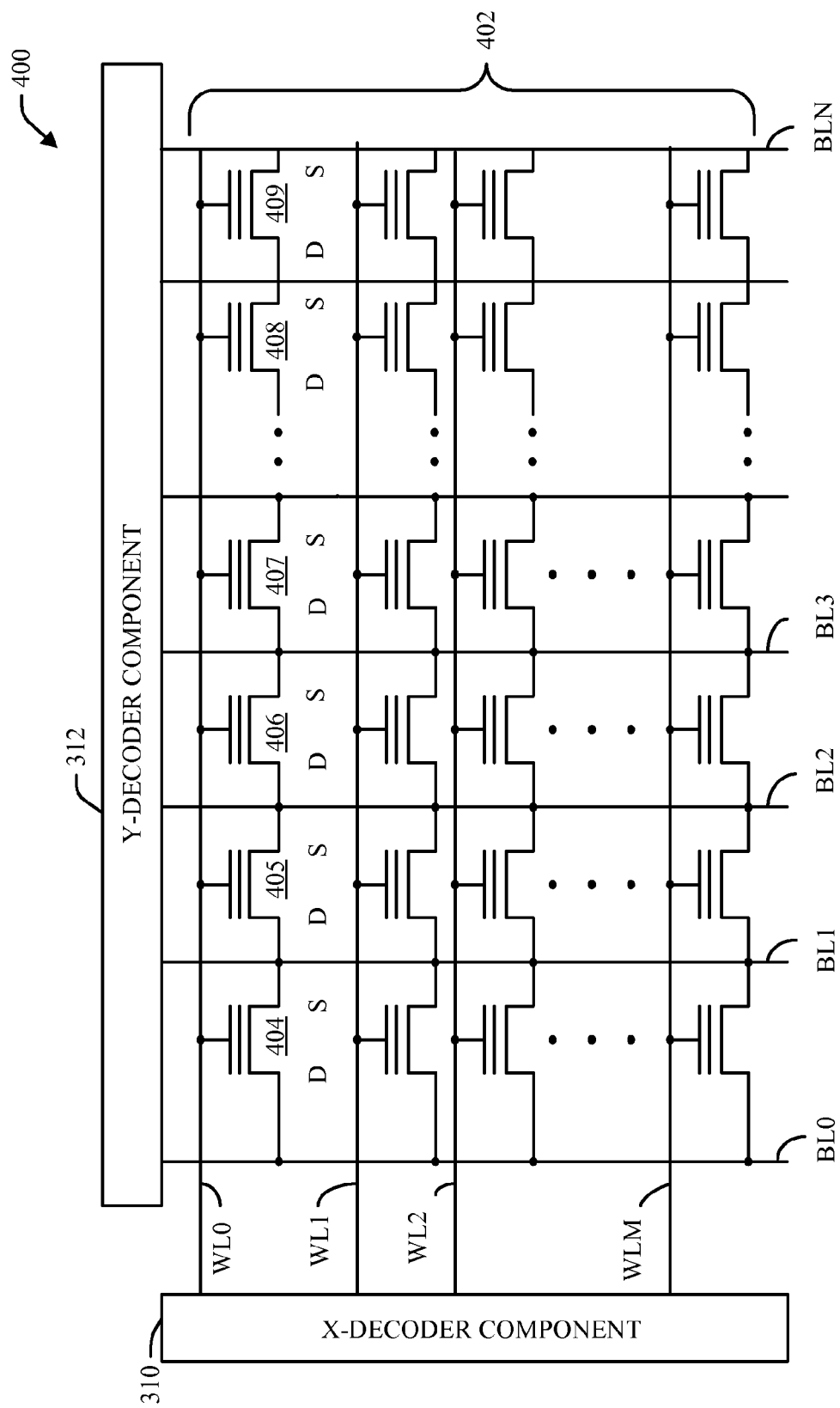
FIG. 4a depicts a portion of a memory device in accordance with an aspect of the disclosed subject matter.

Turning to FIG. 4a, depicted is an example diagram of a portion of a memory device 400 that can facilitate data storage in accordance with the disclosed subject matter. The memory device 400 can include a memory array(s) 402 that can include a plurality of memory cells, which can include memory cells 404, 405, 406, 407, 408, and 409, for example, where each memory cell can be comprised of a drain (e.g., 120), gate (e.g., 116), and source (e.g., 118). In accordance with an aspect, one or more bits of data can be stored in each memory cell (e.g., 404) of the plurality of memory cells. In accordance with another aspect, each memory cell (e.g., 404) of the plurality of memory cells can be a multi-level cell, where data can be represented by the level of charge stored within the cell. It is to be appreciated that the memory array 402 can be the same as or similar to memory array 102 as more fully described with respect to memory device 100 and/or the memory array(s) included in the core(s) 306 as more fully described in relation with the memory device 300, for example.

The memory device 400 can include an X-decoder component(s) 310 (e.g., word line (WL) decoder) and a Y-decoder component(s) 312 (e.g., bit line (BL) decoder) that can each respectively decode inputs/outputs during various operations (e.g., programming, reading, verifying, erasing) that can be performed on the memory cells (e.g., 404). The X-decoder component 310 and Y-decoder component 312 can each receive address bus information from a host processor (not shown) and/or system controller (not shown) or the like, and can utilize such information to facilitate accessing or selecting the desired memory cell(s) (e.g., 404) (e.g., memory location(s)) associated with the command. The memory cells (e.g., 404) can be formed in M rows and N columns. A common WL can be attached to the gate of each memory cell (e.g., 404) in a row, such as word-lines WL0, WL1, WL2, through WLM. A common BL can be attached to each cell (e.g., 404) in a column, such as bit-lines BL0, BL1, through BLN. A WL can contain, for example, a plurality of elements (e.g., 512, 1024, 2048, etc.) forming multiple words. A sector can include a plurality of WLs, such as, for example, 512 WLs that can provide 512k or more elements of memory. In accordance with an aspect of the disclosed subject matter, respective voltages can be applied to one or more memory cells (e.g., 404) through the WLs and BLs to facilitate performing operations, such as program, read, erase, and the like.

It is to be appreciated that while the memory cells (e.g., 404) are shown as being respectively associated with a drain and a source, in accordance with one embodiment, where a memory cell (e.g., 404) contains charge storage components (e.g., 114) on two sides of the cell (e.g., 404) that can each be programmed with data (e.g., charge stored therein), the drain can act as the source, and/or the source can act as the drain, depending on which charge storage component of the memory cell (e.g., 404) is being charged during a given operation.

Figure 4B:
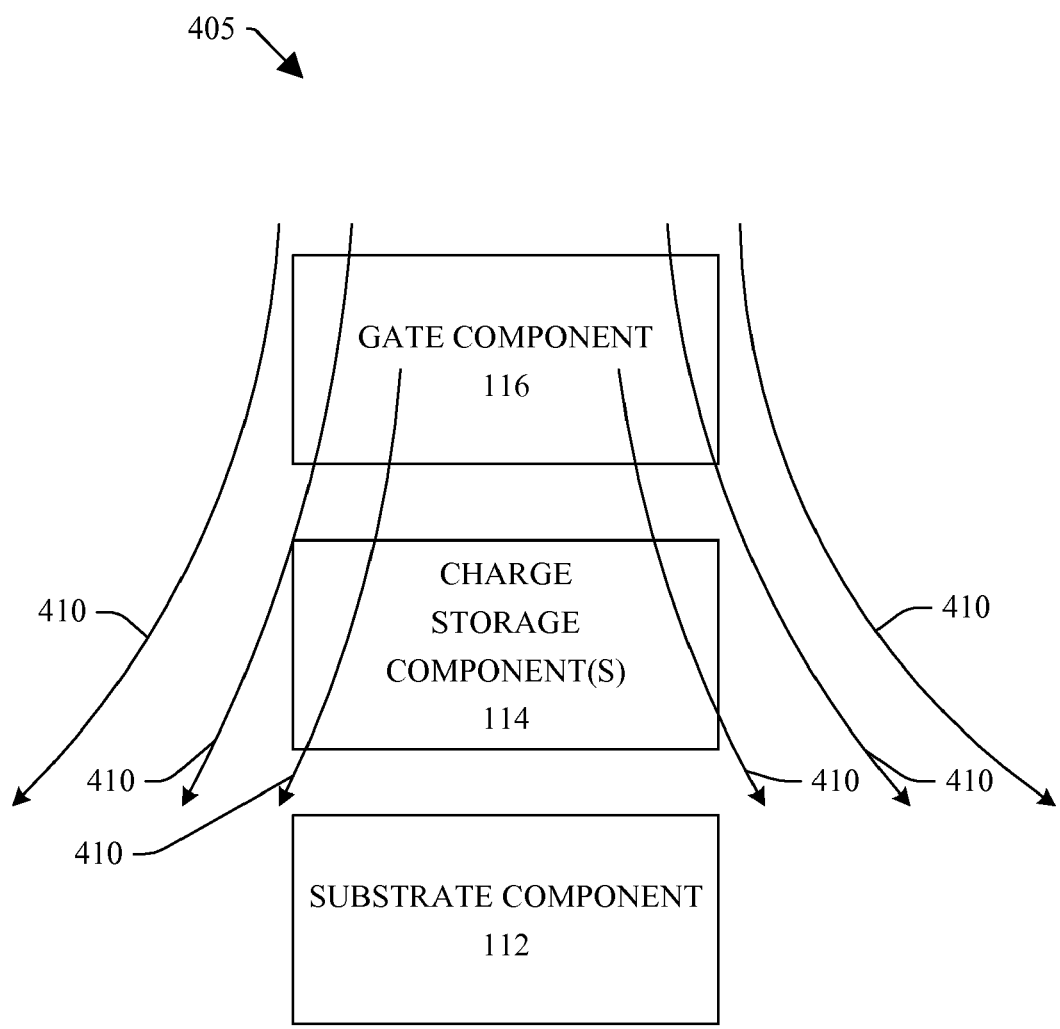
FIG. 4b illustrates a diagram of an electromagnetic field associated with a memory cell subject to fringing effect.

Referring to FIG. 4b, depicted is a diagram of memory cell 405 that can store data in accordance with an aspect of the disclosed subject matter. In one aspect, the memory cell 200 can be one of a plurality of memory cells that can be included in a memory device (e.g., memory device 400 as illustrated in FIG. 4a), which can be a nonvolatile memory (e.g., flash memory, EEPROM, etc.). In another aspect, the memory cell 405 be formed in an ORPRO configuration.

The memory cell 405 can associated with a substrate component 112, a charge storage component(s) 114, and a gate component 116 that can each have the same or similar functionality, respectively, as more fully described herein, for example, with regard to memory device 100, memory device 200, and/or memory device 300.

During an erase operation, such as an FN channel erase, to remove charge stored in the charge storage components 114, certain memory cells can be selected to be erased at a given time. For example, memory cell 405 can be selected to be erased, while memory cell 404 (depicted in FIG. 4a; not shown in FIG. 4b) and memory cell 406 (depicted in FIG. 4a; not shown in FIG. 4b) remain unselected. As memory cell 405 is selected for erase, a predetermined voltage potential (e.g., −18 volts), which can be based in part on a negative bias (e.g., −8 volts) applied to the word line associated with memory cell 405 and a positive bias (e.g., +10 volts) applied to the substrate 112. Since memory cells 404 and 406 remain unselected, the WLs respectively associated therewith remain at 0 volts, and there can be substantially zero voltage potential applied to such cells 404, 406. The predetermined voltage potential associated with memory cell 405 can move towards the lower potential areas, such as memory cells 404 and 406, which can result in the electromagnetic field lines 410 becoming less vertical with respect to memory cell 405 during the erase of cell 405 and can result in an undesirable fringing effect with respect to the electromagnetic fields. As a result, the erase of the memory cell 405 can be negatively impacted (e.g., higher electromagnetic field in the top oxide layer of the memory cell, smaller erase window, decreased erase speed, etc.).

Figure 4C:
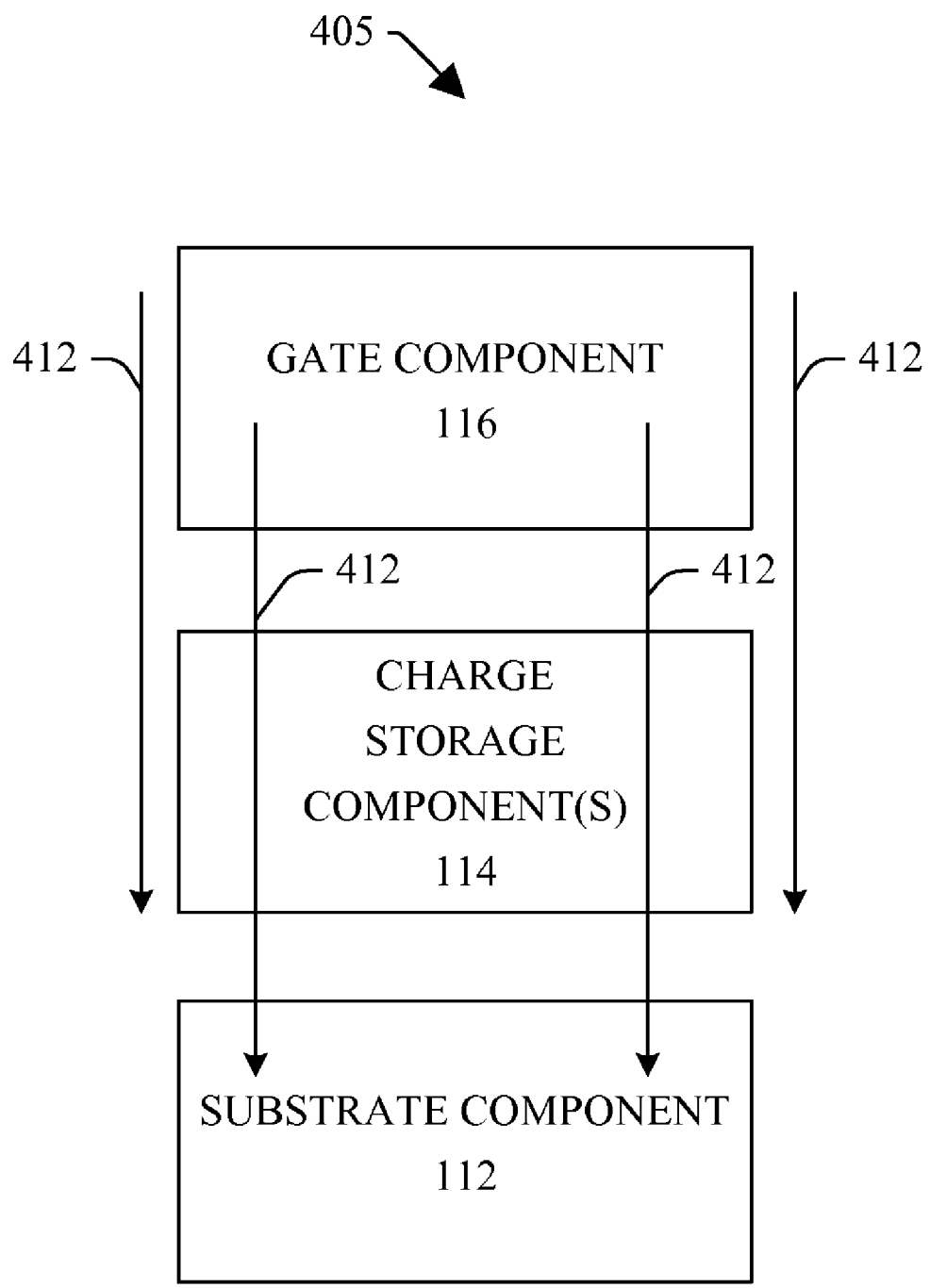
FIG. 4c illustrates another diagram of an electromagnetic field associated with a memory cell in a memory device in accordance with an aspect of the subject innovation.

Turning to FIG. 4c, depicted is a diagram of a memory cell 405 that can store data in accordance with an aspect of the disclosed subject matter. In one aspect, the memory cell 405 can be part of memory device 400, which can be a flash memory device that can have an ORPRO configuration. During an erase operation (e.g., FN channel erase) to remove charge stored in the charge storage components 114, certain memory cells can be selected to be erased at a given time. In accordance with one aspect, an optimization component 122 (not shown) can facilitate selecting memory cells (e.g., 405) such that a subset of memory cells can be selected for erase at the same time such that each memory cell in the subset of memory cells can have two neighbor memory cells adjacent to (e.g., on each side of) such memory cell that can be included in the subset of memory cells selected for the erase (e.g., except for an end-row memory cell and/or an end-of-subset memory cell, each of which can have one neighbor memory cell adjacent thereto).

For example, the optimization component 122 can facilitate selecting memory cell 405 to be erased as well as selecting for erase the two memory cells that are adjacent to memory cell 405, which can be memory cell 404 (depicted in FIG. 4a; not shown in FIG. 4c) and memory cell 406 (depicted in FIG. 4a; not shown in FIG. 4c), for instance. As memory cell 405 and neighbor memory cells 404 and 406 are selected for erase, a predetermined voltage potential (e.g., −18 volts), which can be based in part on a negative bias (e.g., −8 volts) applied to a respective word line associated with a respective memory cell and a positive bias (e.g., +10 volts) applied to the substrate 112, can be applied to each selected memory cell 404, 405, 406. Since the voltage potential associated with memory cell 405 can be the same or substantially the same as the respective voltage potentials associated with memory cells 404 and 406, there is substantially no area of lower voltage potential that can draw the voltage potential associated with memory cell 405 away from the memory cell 405 during the erase. As a result, the electromagnetic fields generated based in part on the predetermined voltage potential associated with memory cell 405 can be vertical or substantially vertical with respect to memory cell 405, as illustrated by electromagnetic field lines 412. As further result, there can be a reduction and/or minimization of an undesirable fringing effect with respect to the electromagnetic fields 412, which can facilitate improving the erase of memory cell 405, as there can be an increase in erase speed, a lower electromagnetic field in the top oxide layer of the memory cell 405, an improved erase window, etc.

Figure 5:
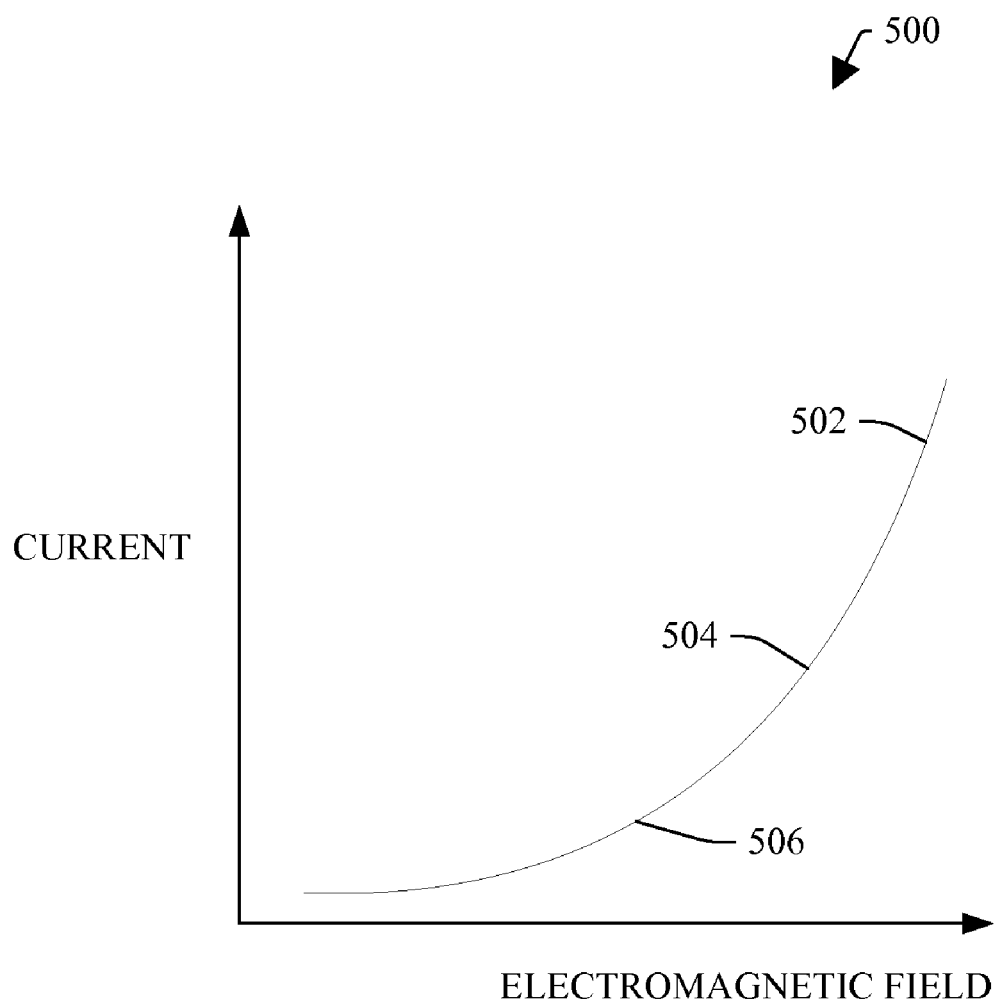
FIG. 5 depicts a graph associated with the current an electromagnetic field associated with an erase of a memory cell in a memory device in accordance with an aspect of the disclosed subject matter.

Referring to FIG. 5, illustrated is an exemplary graph 500 relating to erase current verses electromagnetic field with regard to an erase of a memory cell(s) in a memory device in accordance with an aspect of the disclosed subject matter. Graph 500 shows an example of a curve 502 that can relate to the increase in the erase current in relation to an increase in an electromagnetic field as it pertains to an erase of a memory cell (e.g., 405) in a memory device (e.g., 400).

During an erase operation to erase a memory cell, it can be desirable to have a lower current and thus a lower magnetic field, particularly in the top oxide layer of an ORPRO memory cell (e.g., 405). Reference numeral 504 shows a current level and corresponding electromagnetic field level associated with an erase of a memory cell (e.g., 405) that can have a predetermined voltage potential (e.g., −18 volts) applied thereto, while memory cells (e.g., 404 and 406), which can be adjacent to such memory cell, can have a 0 volt potential, or approximately a 0 volt potential) applied thereto. The current level and electromagnetic field level at reference numeral 504 can relate to the current level and field level associated with the gate component (e.g., 116) and charge storage component (e.g., 114) of the memory cell being erased. Since the memory cells adjacent to such memory cell (e.g., 405) have a 0 volt potential, the predetermined voltage potential applied to such memory cell can be drawn towards the lower potential areas associated with the adjacent memory cells, which can result in an undesirable fringing effect with respect to such memory cell. As further result, to erase the cell, a higher erase current and electromagnetic field are applied to erase the memory cell (e.g., 405), as depicted at reference numeral 504, as compared to the erase current level and corresponding electromagnetic field level at reference numeral 506.

Reference numeral 506 can relate to an erase current level and corresponding electromagnetic field level associated with an erase of a memory cell (e.g., 405) where the neighbor memory cells (e.g., 404, 406) that can be adjacent to such memory cell can also be selected for erase and can have the same or substantially the same predetermined voltage potential (e.g., −18 volts) applied thereto. The current level and electromagnetic field level at reference numeral 506 can relate to the current level and field level associated with the gate component (e.g., 116) and charge storage component (e.g., 114) of the memory cell (e.g., 405) being erased. The lower erase current and electromagnetic field associated with reference numeral 506, as compared to reference numeral 504, can be desirable during an erase of a memory cell as the lower current level and field level can result in an improved erase of the memory cell, as there can be less power consumption by the memory device during the erase, an improved erase speed, a reduction in erase saturation (e.g., a reduction in back tunneling associated with the gate component (e.g., 116)), and/or an improved erase window.

Figure 6:
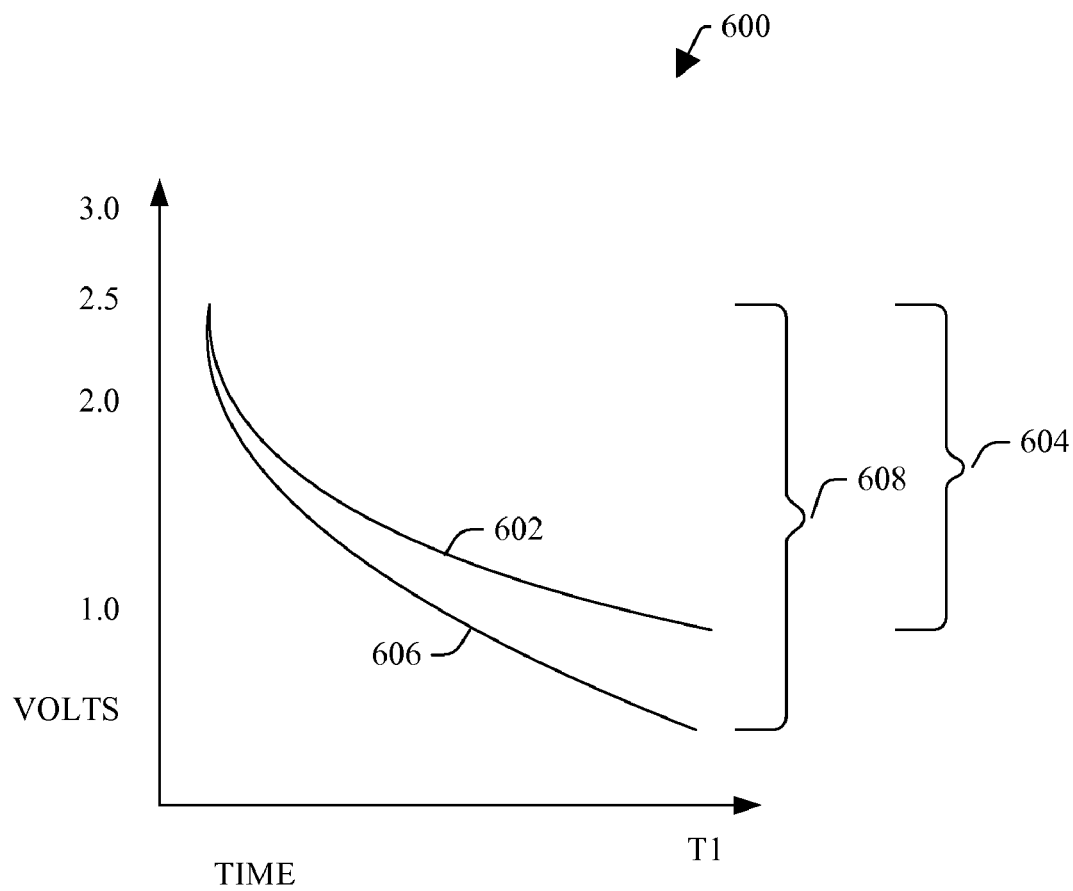
FIG. 6 illustrates a graph related to an erase window associated with a memory cell in a memory device in accordance with an aspect of the disclosed subject matter.

Referring to FIG. 6, illustrated is an exemplary graph 600 relating to the erase window associated with a memory cell in a memory device in accordance with an aspect of the disclosed subject matter. The graph 600 can depict the erase window, in volts, associated with a memory cell (e.g., 405) over time. A first plot 602 can relate to the erase window associated with a memory cell (e.g., 405) that can be erased, where neighbor memory cells (e.g., 404, 406) that can be adjacent to such memory cell are not erased at the same time. At time T1, which can be the point in time when the erase window of the erased memory cell has reached its maximum range, the erase window 604 of the erased memory cell can range from 2.5 volts to 0.8 volts.

The second plot 606 can relate to the erase window of a memory cell (e.g., 405) where the neighbor memory cells (e.g., 404, 406) that can be adjacent to such memory cell are erased at the same time, and thus, can have the same or substantially the same voltage potential applied thereto during the erase as the memory cell (e.g., 405). At time T1, the erase window 608 can range from 2.5 volts to 0.3 volts. As illustrated in graph 600, there can be an improvement of 0.5 volts in the erase window for the erase of the memory cell associated with plot 606, as compared to the erase of the memory cell associated with plot 602. In accordance with one aspect, an optimization component 122 (not shown) can facilitate erasing the memory cell (e.g., 405) such that there can be an improved (e.g., increased) erase window (e.g., 606), as depicted in graph 600.

Figure 7:
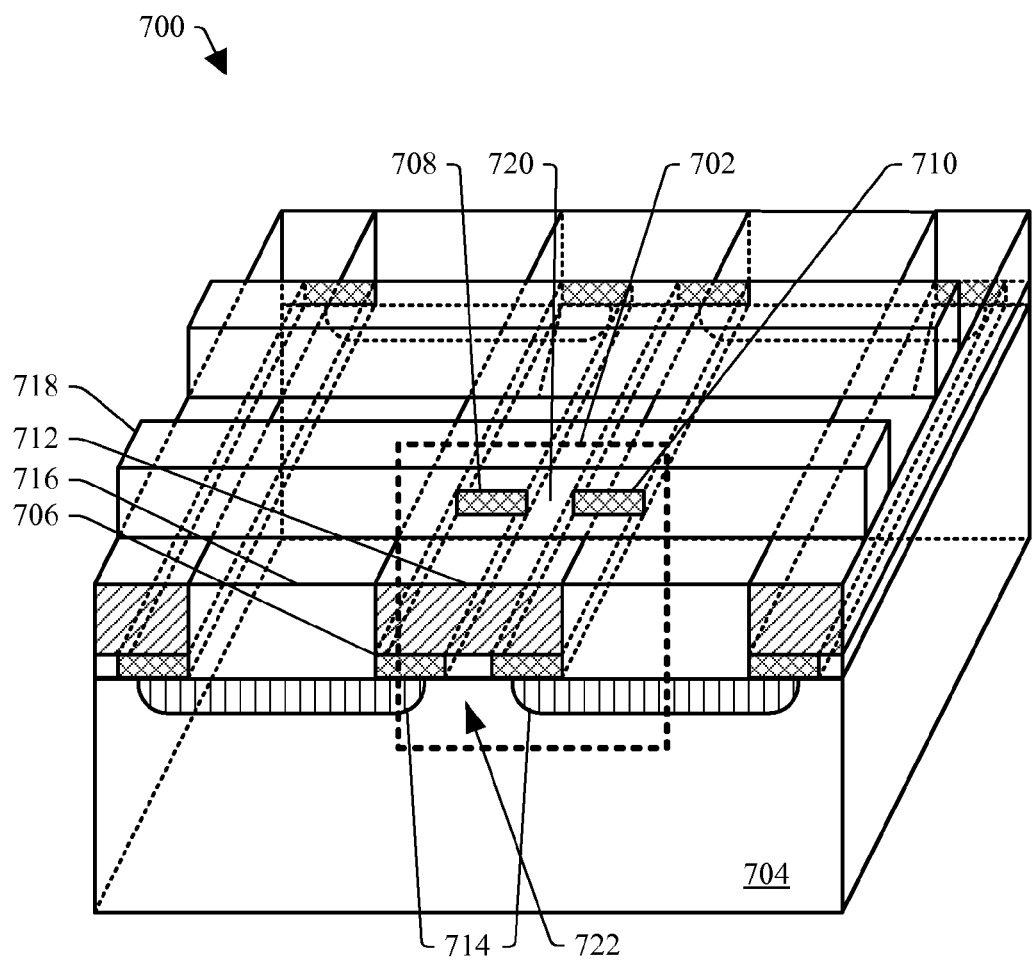
FIG. 7 illustrates an example of a memory cell of a memory device in accordance with an aspect of the disclosed subject matter.

FIG. 7 is a cross-sectional isometric illustration of a portion of a memory device 700 that can contain a multi-bit memory cell in accordance with an embodiment of the disclosed subject matter. The multi-bit memory cell 1602 can be formed on a semiconductor substrate 704. The memory cell 702 can contain a charge storage layer 706 that can contain two charge storage nodes 708, 710 that can be on the semiconductor substrate 704; a first polysilicon 1612 that can be on the charge storage layer 706; a pair of bit lines 714 that can be in the semiconductor substrate 704 and can be adjacent to the charge storage layer 706 and under a bit line dielectric 716; and a word line 718. In accordance with one embodiment, the two charge storage nodes 708, 710 can be physically separated by a central dielectric 720 in the charge storage layer 706. In another embodiment, the two charge storage nodes are not physically separated in a single charge storage layer (not shown). The memory cell 702 can be separated from adjacent memory cells by the bit line dielectric 716 such as oxides (e.g., silicon oxide, high temperature oxide (HTO), high density plasma (HDP) oxide).

Since the memory cell 702 can have the two charge storage nodes 708, 710, the memory cell 702 can store at least two physically distinct bits of data (e.g., two bits of data, four bits of data, etc.). Each bit of data within the memory cell 702 serves as a binary unit of data (e.g., either 1 or 0) that can be mapped directly to a memory array (e.g., 102). Reading or programming one side of charge storage nodes (e.g., 708, 710) can occur independently of the data that can be stored on the opposite side of the charge storage nodes (e.g., 708, 710).

Two conductive bit lines 714 are depicted in FIG. 7 underlying the charge storage layer 706. It will be appreciated that any number of such bit lines can be implanted into the semiconductor substrate 704. The bit lines 1614 typically contain an implanted n-type material, such as arsenic, and can include an oxide portion (not shown) in accordance with some embodiments of the disclosed subject matter. The two conductive bit lines 714 can be spaced apart and can define a channel region 722 therebetween. The semiconductor substrate 704 can contain pocket implant regions (not shown) adjacent the charge storage layer 706. The pocket implant regions typically can contain an implanted p-type material, such as boron. The pocket implant regions can facilitate controlling a threshold voltage of the memory cell 702.

Two conductive word lines 718 are similarly depicted overlying the charge storage layer 706. It will be appreciated that any number of such WLs can be formed over the charge storage layer 706. The word lines 718 can contain a polysilicon material, for example, where the polysilicon material can be deposited over the charge storage layer 706 and then patterned and etched.

Locations 708 and 710 can indicate generally where respective bits of data can be stored in a memory cell 702. It will be appreciated that the channel 722 can have an effective length and that the bits will be brought closer together as this length can be reduced (e.g., as a result of scaling). Also, it is to be appreciated that memory device 700 can be included in memory device 100, memory device 300, and/or memory device 400, for example.

Figure 8A:
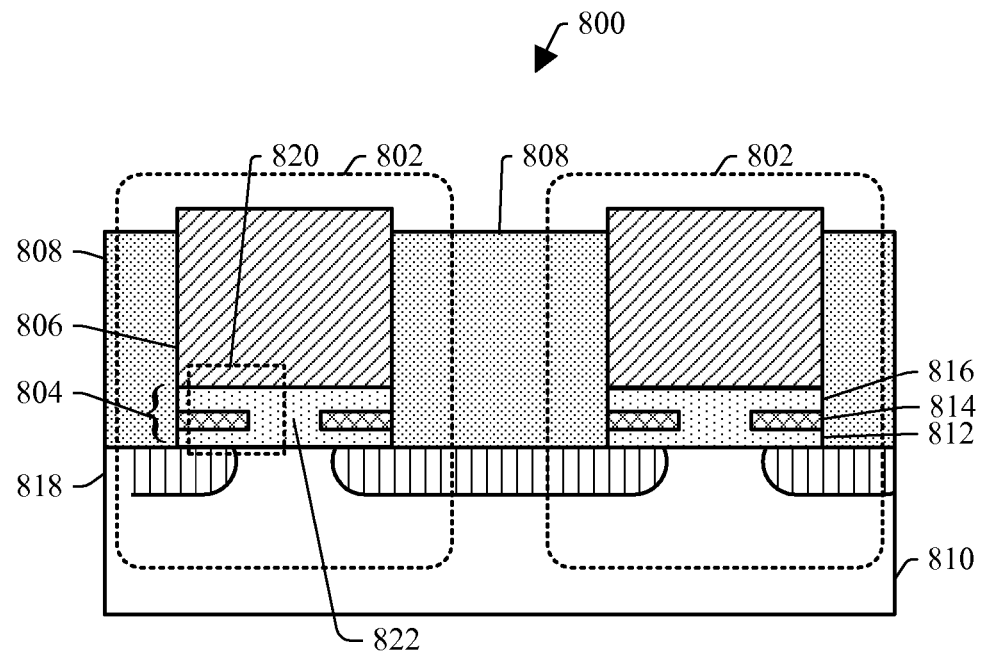
FIG. 8a depicts another example of a memory cell of a memory device in accordance with an aspect of the disclosed subject matter.

Referring to FIG. 8a, illustrated is a cross sectional view of a portion of an exemplary memory device 800. Memory device 800 can include a memory cell(s) 802 that can contain one or more charge storage layers 804, a first polysilicon 806, and a bit line dielectric 808 that can be formed over a semiconductor substrate 810. The charge storage layer(s) 804 can contain a gate oxide 812, one or more charge storage elements 814, and a first top oxide 816. The semiconductor substrate 810 can contain bit lines 818 containing, for example, one or more n-type dopants (e.g., arsenic, phosphorous, antimony). The memory device 800 can further contain other layers/components. For example, the memory device 800 can contain a tunnel oxide (not shown) between the charge storage layer 804 and the semiconductor substrate 810. A portion of the charge storage layer 804 indicated by a dashed line 820 in FIG. 10a is exploded in FIG. 10b.

The semiconductor substrate 810 can contain any suitable semiconductor material on which electric devices such as memory cell transistors can be formed. Examples of semiconductor materials include silicon, gallium arsenide, indium phosphide, and the like.

The first polysilicon 806 can be formed on the semiconductor substrate 810 by, for example, chemical vapor deposition (CVD). The height of the first polysilicon 906 can vary based in part on desired implementations and/or the memory device 800 being fabricated. In one embodiment, the height of the first polysilicon 806 can be in the range of approximately 50 nm to 300 nm, inclusive. In another embodiment, the height of the first polysilicon 806 can be in the range of approximately 60 nm to 200 nm, inclusive. In yet another embodiment, the height of the first polysilicon 806 can be in the range of approximately 70 nm to 150 nm, inclusive. In still yet another embodiment, the height of the first polysilicon 806 can be approximately 100 nm.

The bit line dielectric 808 can contain any suitable dielectric material. The memory cells 802 can be typically separated from each other with the bit line dielectric 808. General examples of dielectrics include silicon based dielectric materials, oxide dielectric materials, silicates, low k materials, and the like. Examples of silicon based dielectric materials include silicon dioxide, silicon oxynitride, high-density plasma (HDP) oxide, and the like. Examples of silicates include fluorine doped silicon glass (FSG), tetraethylorthosilicate (TEOS), borophosphotetraethylorthosilicate (BP-TEOS), phosphosilicate glass (PSG), borophosphosilicate glass (BPSG), other suitable spin-on glasses, and the like.

The bit line dielectric 808 can be formed by any suitable technique including CVD such as plasma enhanced CVD. The height of the bit line dielectric 808 can vary and can be based in part on, for example, the desired implementation(s) and/or the memory device 800 being fabricated. In one embodiment, the height of the bit line dielectric 808 can be in the range of approximately 10 nm to 200 nm, inclusive. In another embodiment, the height of the bit line dielectric 808 can be in a range from approximately 20 nm to 100 nm or less, inclusive. In yet another embodiment, the height of the bit line dielectric 808 can be in the range of approximately 30 nm to 80 nm, inclusive. In still yet another embodiment, the height of the bit line dielectric 808 can be approximately 50 nm.

The charge storage layer 804 can contain the gate oxide 812, the charge storage element 814, and the first top oxide 810 can be formed over the semiconductor substrate 810. The configuration and/or constituent of the charge storage layer 804 can vary, as desired. In one embodiment, the charge storage layer 804 can contain a single charge storage element 814 therein. In another embodiment, the charge storage layer 804 can contain two or more charge storage elements 814 therein. For example, the charge storage layer 804 can contain two charge storage elements 814 that can be separated from each other by a central dielectric 822 such as oxides.

The gate oxide 812 can contain any suitable oxide material. Examples of oxide materials include silicon oxide. The gate oxide 812 can be formed on the semiconductor substrate 810 by any suitable technique. For example, the gate oxide 812 can be formed on the semiconductor substrate 810 by thermal oxidation, CVD, and the like.

The charge storage element(s) 814 can contain any suitable dielectric material that can store and/or trap charges. The charge storage element 814 can contain one or more layers containing the charge storage dielectric material. General examples of charge storage dielectric materials include nitrides (e.g., silicon nitride, silicon oxynitride, and silicon rich silicon nitride), oxides, silicates, a high-k dielectric, for example, having a dielectric constant higher than that of silicon dioxide (SiO2), and the like. In one embodiment, the charge storage dielectric material can contain silicon nitride, silicon oxynitride, and/or silicon rich silicon nitride. In another example, the charge storage dielectric material contains oxides or silicates containing Al, Ta, Hf, La, Zr, Ti, Nb, Cr, V, Y, Ce and/or Pr. The charge storage element(s) 814 can be formed on the gate oxide 812 by any suitable technique. For example, the charge storage element 814 can be formed by CVD, lithography, and etching techniques.

The first top oxide 816 can contain any suitable oxide material. Examples of oxide materials can include silicon oxide. The first top oxide 816 can be formed around the surface of the charge storage element 814. The first top oxide 816 can be formed by any suitable technique. For example, the top oxide 816 can be formed by thermal oxidation, plasma oxidation, CVD, and the like.

In this example, the charge storage layer 804 can contain two charge storage elements 814 and the space between the charge storage elements 814 on the semiconductor substrate 810 can be filled with the first top oxide material (e.g., central dielectric 822). The oxide material at the space (e.g., central oxide 822) can be formed at any suitable time. For example, the central oxide 822 can be formed before the charge storage element 814 can be defined/formed. The central oxide 822 can be formed at the same time that the charge storage element 814 and/or the first top oxide 816 can be defined/formed. The central oxide 822 can be formed after the charge storage element 814 can be defined/formed. In another embodiment, the space between the charge storage elements 814 on the semiconductor substrate 810 is not filled with the first top oxide material, and the first top oxide 816 can be formed around only the surface of the charge storage element 814 (not shown).

The heights of the gate oxide 812 and first top oxide 816 can vary and can have virtually any respective suitable height, which can be based in part on the desired implementations and/or the memory device 800 being fabricated. In one embodiment, the respective heights of the gate oxide 812 and first top oxide 816 can be in the range of approximately 1 nm to approximately 10 nm, inclusive. In another embodiment, the respective heights of the gate oxide 812 and first top oxide 816 can be in the range of approximately 2 nm to approximately 8 nm, inclusive. In yet another embodiment, the respective heights of the gate oxide 812 and first top oxide 816 can be in the range of approximately 3 nm to approximately 7 nm, inclusive. In still yet another embodiment, the respective heights of the gate oxide 812 and first top oxide 816 can be approximately 5 nm.

The height of the charge storage element(s) 814 can vary and can be any suitable height that can be based in part on the desired implementations and/or the memory device 800 being fabricated. In one embodiment, the height of the charge storage element(s) 814 can be in the range of approximately 1 nm to approximately 20 nm, inclusive. In another embodiment, the height of the charge storage element(s) 814 can be in the range of approximately 2 nm to approximately 15 nm, inclusive. In yet another embodiment, the height of the charge storage element(s) 814 can be in the range of approximately 3 nm to approximately 10 nm, inclusive. In still yet another embodiment, the height of the charge storage element(s) 814 can be approximately 7 nm. It is to be appreciated that memory device 800 can be included in memory device 100, memory device 300, and/or memory device 400, for example.

Figure 8B:
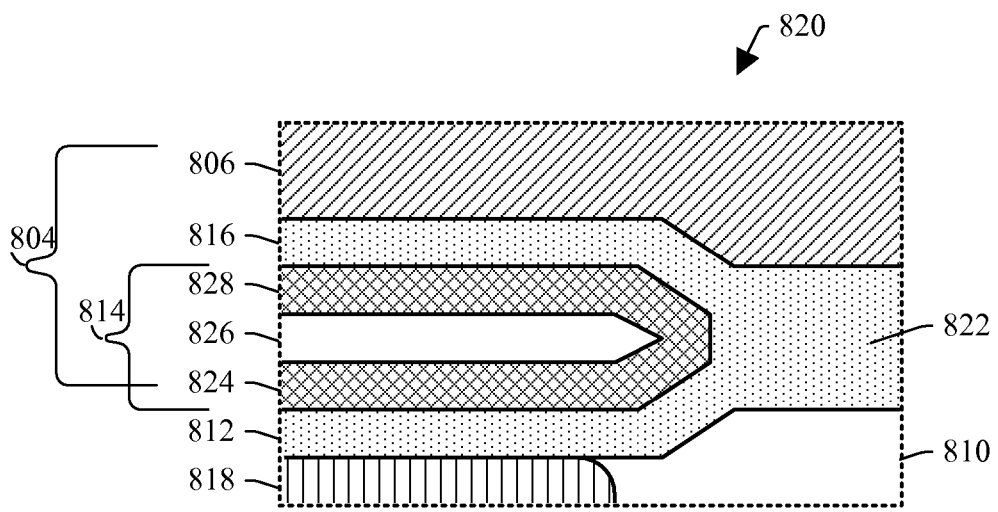
FIG. 8b illustrates a portion of a memory cell in a memory device in accordance with an aspect of the disclosed subject matter.

FIG. 8*b* illustrates an exploded view 820 of an exemplary charge storage layer 804 of FIG. 8*a*. In this example, the charge storage layer 804 can contain five separate layers, for example, an oxide layer (gate oxide 812), a first charge storage dielectric material 824, a polysilicon layer 826, a second charge storage dielectric material 828, and an oxide layer (first top oxide 816). For example, the charge storage layer 804 can contain five separate layers: a gate oxide 812 layer, a first nitride 824 layer, a polysilicon 826 layer, a second nitride 828 layer, and a first top oxide 816 layer. The first and fifth oxide layers can contain any suitable oxides such as silicon dioxide ($SiO_2$). The first and second nitride layers can contain any suitable nitrides such as silicon nitride ($Si_xN_y$). That is, the charge storage element 814 can contain nitrides such as silicon nitrides.

The oxide/nitride/polysilicon/nitride/oxide configuration can be referred to as an ORPRO layer when the first and second nitrides contain silicon rich silicon nitride. The oxide/nitride/polysilicon/nitride/oxide layer can be fabricated by forming a first silicon oxide layer, forming a first silicon rich silicon nitride layer on the first silicon oxide layer, forming a polysilicon layer on the first silicon rich silicon nitride, forming a second silicon rich silicon nitride on the polysilicon layer, forming a second silicon oxide layer on the second silicon rich silicon nitride, and forming a first top oxide layer on the second silicon rich silicon nitride layer. The fabrication process of the oxide/nitride/polysilicon/nitride/oxide layer can include CVD, masking, lithography, and etching techniques. In one embodiment, the edges of the first and second charge storage dielectric layers can be contacted with each other, and the edge of the polysilicon layer can be wrapped with the first and second charge storage dielectric layers. In another embodiment, the thickness of the central dielectric 822 can be smaller than the thickness of the charge storage layer 804. In yet another embodiment, the thickness of the central dielectric 822 can be substantially equal to the thickness of the charge storage layer 804 (not shown).

Although not shown in FIG. 8b, in accordance with one embodiment, the charge storage layer 804 can contain three separate layers: oxide (gate oxide)/charge storage dielectric material (charge storage element)/oxide (first top oxide). The oxide/nitride/oxide configuration may be referred to as an ONO layer. Especially, when the nitride layer contains silicon rich silicon nitride, the oxide/nitride/oxide configuration can be referred to as an ORO tri-layer. The oxide/nitride/oxide tri-layer can be fabricated by forming a first silicon oxide layer, forming a silicon nitride layer on the first silicon oxide layer, and forming a second silicon oxide layer on the silicon nitride layer.

Fabrication of memory device 800 can be done with any suitable polysilicon etchant that does not substantially affect or damage the integrity of other components/layers of the memory device 800. The polysilicon etching can be dry etching or wet etching. Examples of dry etching include plasma etching, reactive ion etching (RIE), and the like. For example, the plasma etching can be performed with chlorinating agents such as $Cl_2$ or a combination of $BCl_3$ and a halogenated hydrocarbon. The polysilicon etch can also be performed with combinations of, for example, $SiCl_4$, $BCl_3$, HBr, $Br_2$, $SF_6$, and $CF_4$. Additives such as $N_2$, $O_2$, Ar, He, or any other noble gas can be included. Other examples of the polysilicon etchants include tetraalkylammonium hydroxides (e.g., tetramethylammonium hydroxide (TMAH)) and alkali metal hydroxides (e.g., a potassium hydroxide (KOH) and cerium hydroxide (CeOH)).

Fabrication of memory device 800 can be done with any suitable oxide etchant that does not substantially affect or damage the integrity of other components/layers of the memory device 800. The oxide etching can be dry etching or wet etching. Examples of oxide etchants include halogen acids such as hydrofluoric acid. In one embodiment, the oxide etchant can be a hydrofluoric acid solution such as a buffered hydrofluoric acid (BHF: e.g., hydrofluoric acid-ammonium fluoride buffered solution). In another embodiment, the oxide etchant can be a vapor of hydrofluoric acid. In yet another embodiment, the first top oxide 816 can be removed by an oxide etchant gas, such as $SiCl_4Cl_2$, $BCl_3Cl_2$, $CCl_4$, mixtures of fluorinated or chlorinated gases, mixtures of Freon-based gases, and the like.

Any of the herein described oxide layers can be formed by any suitable technique. For example, the oxide layer can be formed by thermal oxidation techniques, deposition techniques such as CVD or spin-on techniques, and the like. In one embodiment, the oxide layer can be formed by oxidizing a portion of the charge storage element(s) 814, for example, an upper portion of the charge storage element(s) 814.

Any suitable oxide material can be employed for the top oxide 816. Examples of oxide materials include a high temperature oxide, low temperature oxide, and the like. In one embodiment, the second top oxide 816 can be grown around the charge storage element(s) 814 in plasma at low temperatures, e.g., plasma-grown oxide. For example, the second top oxide 816 can contain plasma-grown oxide that can be grown at a temperature in the range of approximately 200 degrees Celsius to approximately 600 degrees Celsius, inclusive. In another embodiment, the top oxide 816 can be formed around the charge storage element(s) 814 using a slot plane antenna (SPA) process. In the SPA process, the plasma-grown oxide can be grown in a chamber that can include a microwave slot antenna, which can be used to generate the plasma. The microwave slot antenna can be configured to provide a plasma distribution that results in a plasma-grown oxide having increased uniformity, conformity, and quality compared to conventional plasma oxide. In the SPA process, the species used to grow the oxide can contain one or more of oxygen, argon, or hydrogen, for example. In yet another embodiment, the second top oxide 816 can be a steam oxide that can be grown around the charge storage elements 814 by heating the charge storage elements 814 in the presence of steam.

In one embodiment, the top oxide 816 can be formed by a low temperature oxidation process such as a low temperature radical oxidation, a low temperature plasma oxidation process, and the like. The low temperature oxidation can advantageously not change the electrical properties of components/ layer of the memory device 800. For example, the low temperature oxidation can advantageously not change the doping profile of implanted regions of the semiconductor substrate 810. Any suitable oxygen reactant can be employed in the low temperature oxidation process. For example, atomic oxygen, ozone, ionized oxygen radicals produced in a plasma can be employed. In one embodiment, the top oxide 816 can be formed at a temperature in the range of approximately 200 degrees Celsius to approximately 600 degrees Celsius, inclusive. In another embodiment, the top oxide 816 can be formed at a temperature in the range of approximately 220 degrees Celsius to approximately 550 degrees Celsius, inclusive. In yet another embodiment, the top oxide 816 can be formed at a temperature in the range of approximately 240 degrees Celsius to approximately 500 degrees Celsius, inclusive.

The subject innovation can be implemented in association with various single-bit or multi-bit memory cell types including a SONOS cell. In addition, the innovation can be applicable to such multi-bit memory devices wherein each bit can be used for data or information storage, as well as those in which only certain of the bits of the multi-bit cell can be so used.

The herein described layers can be formed by any suitable technique. For example, a layer can be formed by CVD such as plasma enhanced chemical vapor deposition (PECVD), low pressure chemical vapor deposition (LPCVD), high pressure chemical vapor deposition (HPCVD), and the like. Layers can also be formed employing other techniques, for example, masking, lithography, and etching techniques. A mask can be formed around the charge storage element(s) 814 by, for example, depositing a resist over the semiconductor substrate 810, exposing the resist to a pattern of radiation, and developing the resist into the pattern to cover the charge storage element 814.

Figure 9:
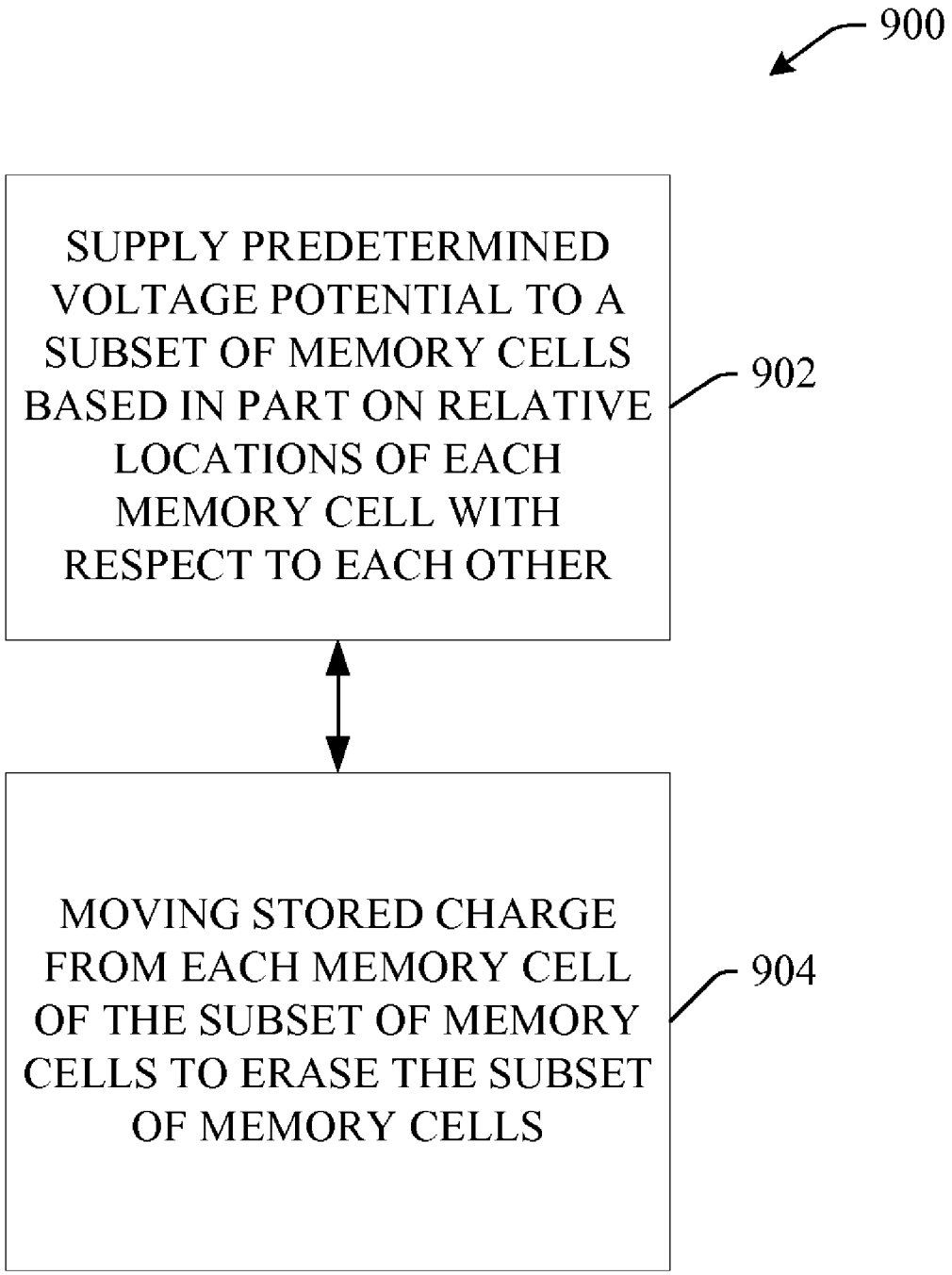
FIG. 9 illustrates a methodology that can facilitate erasing memory cells in a memory device in accordance with an aspect of the disclosed subject matter.
Figure 10:
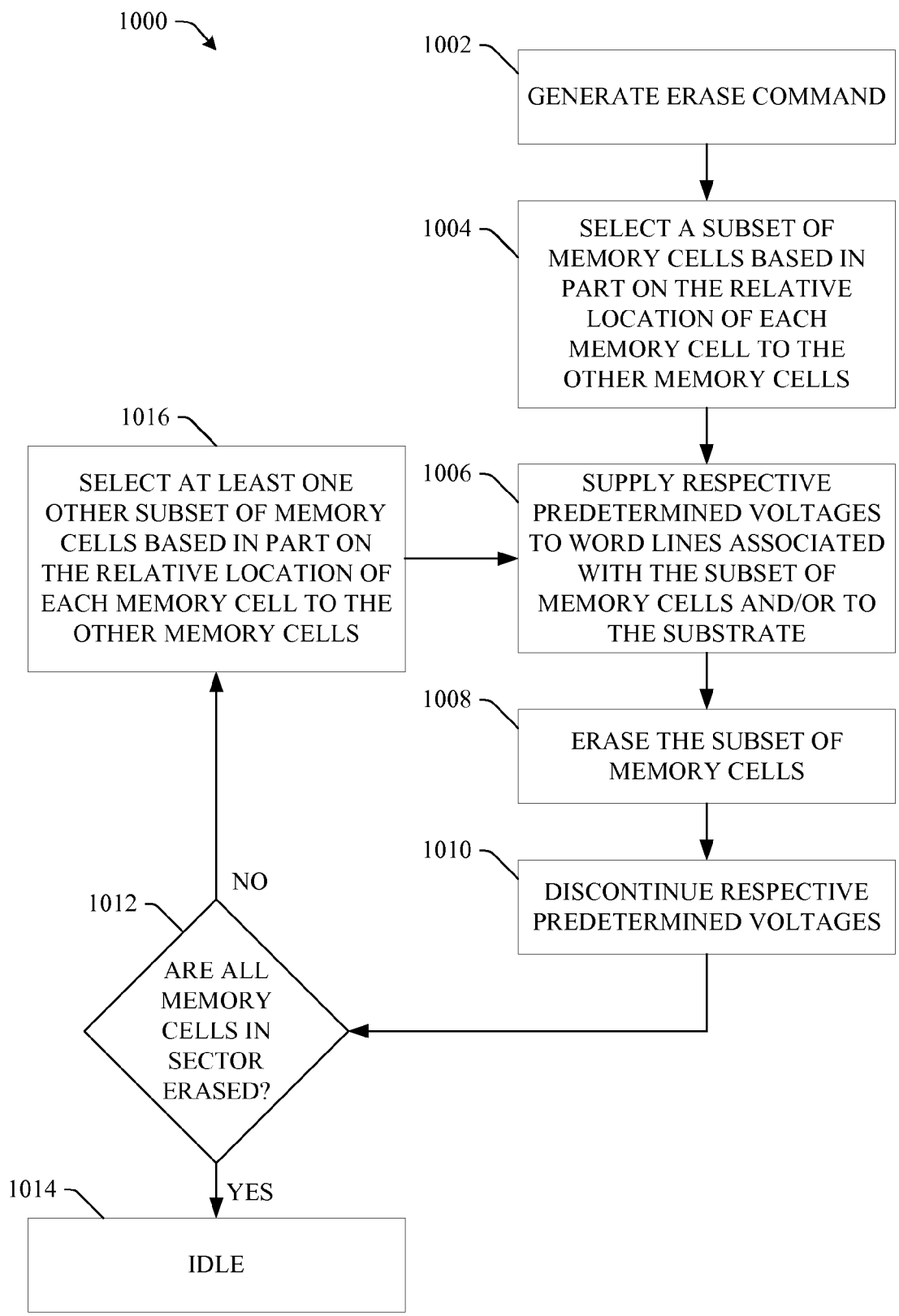
FIG. 10 illustrates another methodology that can facilitate erasing memory cells in a memory device in accordance with an aspect of the disclosed subject matter.
Figure 11:
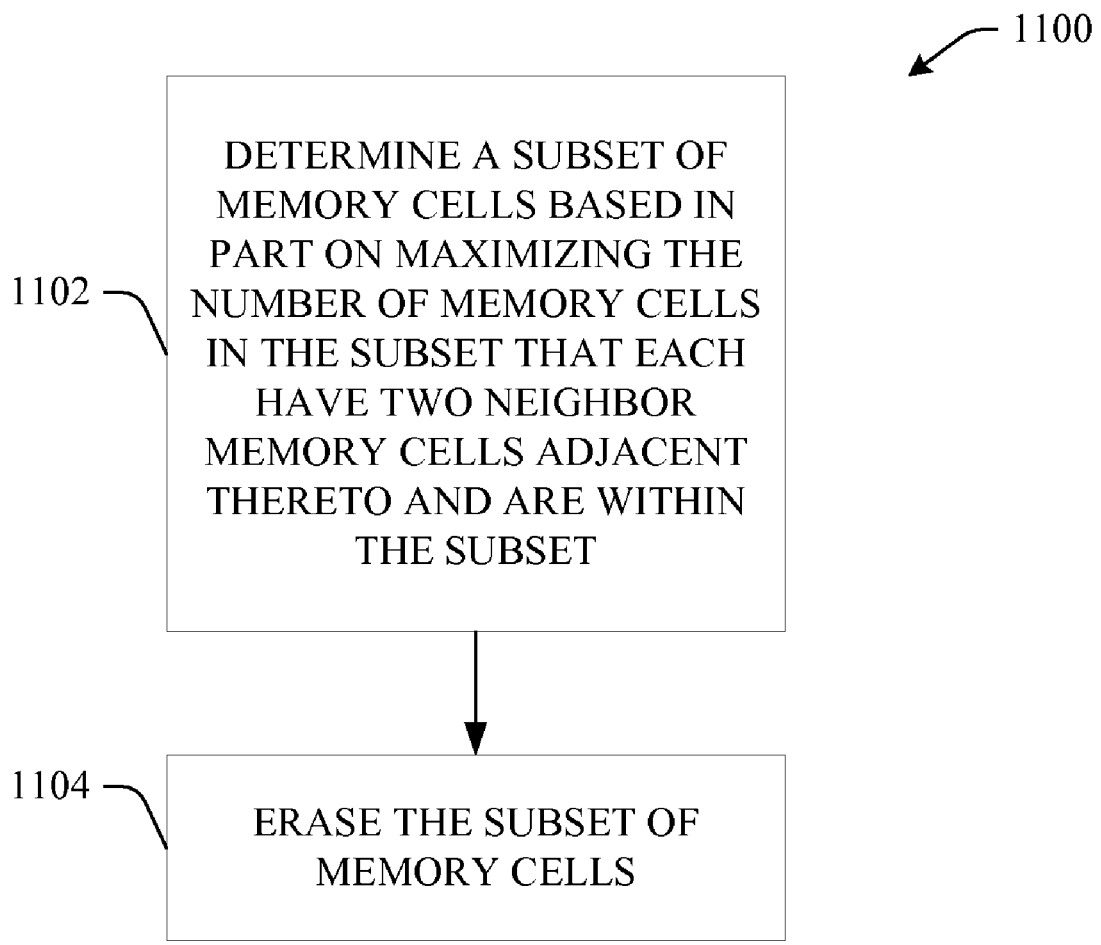
FIG. 11 depicts yet another methodology that can facilitate erasing memory cells in a memory device in accordance with an aspect of the disclosed subject matter.

FIGS. 9-11 illustrate methodologies and/or flow diagrams in accordance with the disclosed subject matter. For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

Turning to FIG. 9, illustrated is a methodology 1900 that can facilitate erasing memory cells in a memory in accordance with an aspect of the disclosed subject matter. At 902, a predetermined voltage potential (e.g., negative bias) associated with an erase operation can be supplied to a subset of memory cells in the memory (e.g., 100) based in part on the relative locations of each memory cell of the subset of memory cells with respect to each other. In one aspect, an optimization component (e.g., 122) can facilitate selecting and/or applying the predetermined voltage potential to a subset of memory cells in a sector of the memory to erase the subset of memory cells. The erase of the subset of memory cells can be performed utilizing an FN channel erase technique. In another aspect, the memory can be a flash memory, and the memory cells in the memory can have an ORPRO configuration, where each memory cell can have one or more charge storage components (e.g., 114) and can store one or more bits of data therein.

The optimization component can facilitate selecting the subset of memory cells based in part on the relative locations of the memory cells of the subset of memory cells with respect to each other. In one aspect, the predetermined voltage potential (e.g., −18 volt potential) applied to each of the cells in the subset of memory cells can be generated by applying a predetermined negative voltage level (e.g., −8 volts) to the WLs respectively associated with each cell of the subset of memory cells and a predetermined positive voltage level (e.g., +10 volts) to the substrate associated with such memory cells.

In accordance with an aspect, the optimization component can facilitate selecting a subset of memory cells such that each memory cell included in the subset of memory cells has two neighbor memory cells adjacent thereto that are also within the subset of memory cells, except where such memory cell is at the end of a row of memory cells in the array and/or where such memory cell is at the end of the subset of memory cells, in which case such memory cell can have one neighbor memory cell adjacent thereto that is within the subset of memory cells. The predetermined voltage potential can be applied to all memory cells in the subset of the memory cells at the same or substantially the same time to facilitate reducing the fringing effect that can disrupt the electromagnetic fields generated to facilitate erasing such memory cells. Reducing the fringing effect associated with such electromagnetic fields can result in an improved erase (e.g., increased erase speed, improved erase window, reduced erase saturation, etc.) of the memory cells.

At 904, charge stored in each memory cell of the subset of memory cells can be moved from each such memory cells to erase the data in the memory cell, where the stored charge can represent and correspond to the data stored in a particular memory cell. At this point, methodology 900 can end.

Conventionally, a flash memory can have a number of sectors that can each have a specified number of memory cells. During an erase operation, when it is desired that particular memory cells in a sector be erase, the entire sector of memory cells is erased due to flash memory characteristics. Conventionally, while all memory cells in a sector are to be erased prior to writing new data to those cells, the memory cells in the sector are not erased at the same time. One reason is that, with regard to certain memory structures, applying the erase voltage to all cells (or to too many cells) in a sector at the same time can result in an undesirable IR drop that can negatively impact the erase of the memory cells. To avoid the undesirable IR drop, conventionally, an even-odd technique can be employed where all memory cells in a sector associated with even numbered WLs can be erased by applying a predetermined erase voltage to those cells, and after those cells are erased, all memory cells associated with odd-numbered WLs can be erased by applying the predetermined erase voltage to such cells. However, erasing memory cells using the even-odd technique can result in an undesirable fringing effect that can negatively impact the electromagnetic fields generated to erase the memory cells, which can thereby result in a negative impact on the erase of the memory cells. For example, erase operation speed can be decreased, erase saturation can be increased, the erase window can be decreased, power consumption can be increased, etc.

The subject innovation can optimize the erase of the memory cells in the sector, in part, by selecting and erasing the memory cells so that, during the erase, a memory cell can have two neighbor memory cells adjacent thereto that are erased at the same time, except where such memory cell is at the end of a row, where the memory cell has only one neighbor cell. As a result, the erase performance of the memory can be improved due in part to the decrease in fringing effect with respect to the electromagnetic fields generated to erase the cells, which can result in the electromagnetic field lines being vertical or substantially vertical with respect to each memory cell being erased.

Referring to FIG. 10, depicted is a methodology 1000 that can facilitate erasing memory cells in a memory in accordance with an aspect of the disclosed subject matter. At 1002, an erase command can be generated. In accordance with one aspect, the erase command can be generated by a processor component (e.g., processor component 1202, described infra). At 1004, a subset of memory cells in a memory (e.g., 100, 300, 400) can be selected for erase based in part on the relative locations of the memory cells associated with the erase command to each other. In one aspect, the subset of memory cells can be selected such that each memory cell within the subset of memory cells can have two other memory cells that can be next to (e.g., adjacent to, on each side of) such memory cell and those other memory cells can be within the subset of memory cells as well, except for end-row memory cells and/or end-of subset memory cells, which can each have at least one other memory cell that can be next to such end-row memory cell or end-of-subset memory cell. The subset of memory cells can also be selected based in part on the erase command information relating to the memory cells to be erased.

In accordance with an aspect, an optimization component (e.g., 122) can facilitate selecting the subset of memory cells in a sector in the memory so that a maximum number of memory cells that can each have two neighbor memory cells adjacent thereto, respectively. In another aspect, the memory can be a flash memory device with an ORPRO configuration. During an FN channel erase, the optimization component can select a subset of memory cells that can include all of the cells in the sector. Due in part to the ORPRO configuration of the memory cells and the FN erase scheme, an entire sector (e.g., sector with 256 WLs, sector with 512 WLs, etc.) of memory cells can be selected to be erased at the same time or substantially the same time, without an undesirable IR drop associated with the memory cells.

In accordance with yet another aspect, the optimization component can select a subset of memory cells that can be less than the entire sector of memory cells, where the subset can be such that the memory cells can each have two neighbor memory cells adjacent thereto that are also in the subset (except for end-row memory cells and/or end-of subset memory cells, which can each have one neighbor cell adjacent thereto). After the first subset of memory cells is erased, the optimization component can select one or more other subsets of memory cells based in part on the neighbor memory cell constraints and can erase each other subset until the entire sector is erased.

At 1006, a predetermined voltage potential can be supplied to each of the memory cells in the subset of memory cells being erased. In one aspect, a predetermined voltage potential can be generated by applying a predetermined negative bias to each WL associated with a memory cell in the subset of memory cells, and a predetermined positive bias to the substrate (e.g., 112) associated with the subset of memory cells, so that the predetermined voltage potential can be applied to each memory cell in the subset at the same or substantially the same time. For example, in one embodiment, −8 volts can be applied to each WL associated with the subset of memory cells and +10 volts can be applied to the substrate, which can result in a voltage potential of −18 volts across each memory cell in the subset. It is to be appreciated that, in other embodiments, other voltage potentials can be applied to the memory cells to effectuate the erase of such cells based in part in the characteristics of the memory cells and/or the memory device, for example.

At 1008, the subset of memory cells can be erased. In one aspect, the predetermined voltage potential applied to each of the memory cells in the subset can facilitate driving electrons (e.g., removing charge) in the respective charge storage component(s) (e.g., 114) of the memory cells out of the charge storage component(s) (e.g., out of the charge trapping layer) and into the substrate. In another aspect, the neighbor memory cell constraints can facilitate reducing the fringe effect that can negatively impact the electromagnetic fields generated to erase each memory cell of the subset as well as reducing the back-tunneling current associated with the top oxide layer and/or the gate component (e.g., 116), which can reduce or eliminate electrons traveling from the gate component to the charge storage component and replacing electrons that traveled from the charge storage component to the substrate, and can thereby improve erase performance of the memory device.

At 1010, the predetermined voltage potential can be discontinued. In one aspect, after each memory cell of the subset of memory cells has the respective charges removed so that each memory cell is in an erased state, the memory controller (e.g., 314) in the memory device can facilitate discontinuing or removing the predetermined voltage potential from the subset of memory cells by discontinuing application of the bias to the WLs associated with the subset and/or application of the bias to the substrate associated with the subset.

At 1012, a determination can be made as to whether all memory cells in the sector are erased. In one aspect, the memory controller can facilitate determining whether all memory cells in the sector are erased. If it is determined that all of the memory cells in the sector are erased, then at 1014, the memory device can idle. For example, the memory device can idle until another command is to be executed by or in the memory device.

If at 1012, it is determined that all memory cells in the sector of the memory device are not erased, then at 1016, at least one other subset of memory cells can be selected based in part on the respective location of the memory cells, which are not erased, to each other. Methodology 1000 can return to reference numeral 1006 to facilitate erasing the memory cells of the at least one other subset of memory cells in accordance with methodology 1000. At this point, methodology 1000 can end.

FIG. 11 illustrates a methodology 1100 that can facilitate erasing memory cells in a memory in accordance with an aspect of the disclosed subject matter. At 1102, the respective locations of memory cells in a sector of the memory can be evaluated. In one aspect, an optimization component (e.g., 122) can examine the respective location of each memory cell in a sector of the memory that is being erased to facilitate determining a subset(s) of memory cells that can be grouped together to be erased at the same or substantially the same time to facilitate improved read performance. At 1104, one or more subsets of memory cells can be determined based in part on maximizing the number of memory cells in a subset of memory cells that each respectively have two neighbor memory cells that can be adjacent to (e.g., next to, at the side of) each respective memory cell and can also be in such subset of memory cells. In accordance with one aspect, the optimization component, which can be in or associated with the memory device (e.g., 100, 300, 400), can facilitate grouping memory cells in a sector of the memory device to be erased at the same or substantially the same time to facilitate improving erase performance of the memory device. The optimization component can select memory cells to be in the subset(s) of memory cells such that there can be a maximum number of memory cells in the subset that can have two neighbor memory cells adjacent thereto that can also be in the subset.

For example, if a sector of memory cells is associated with 6 rows and 6 columns of memory cells (e.g., 36 memory cells), the optimization component can facilitate selecting memory cells that can be in the subset such that there can be a maximizing the number of memory cells that have two neighboring cells that are also in the subset. In one aspect, the optimization component can select all memory cells in the sector, which can maximize the number of memory cells that have two neighboring cells that are also in the subset, as all memory cells in the subset can have two neighbor cells adjacent thereto, except for the 6 end-row cells of the first column and the 6 end-row cells of the sixth column, which can each have one neighbor cell adjacent thereto.

If due to the characteristics of the memory device or for another reason not all memory cells in a sector can be selected to be in the subset to be erased at the same time, then the optimization component can select the memory cells from the sector that can be in the subset so as to maximize the number of memory cells that can have two neighbor cells that are also in the subset. To further illustrate with the 6-row, 6-column example, if only 24 cells of the 36 cells can be erased at the same time, the optimization component can select the first 4 rows of cells (e.g., 24 cells) to be in the subset, and then a second subset that can include the last two rows of memory cells, which can result in 24 memory cells that can have two neighbor cells over both subsets, as opposed to, for example, selecting the first four columns to be in a subset and then the next two columns to be in a second subset, which can result in only 12 memory cells that have two neighbor cells over both subsets.

It is to be appreciated that this is just one example relating to the optimization component optimizing the erase process and that the subject innovation is not so limited. The subject innovation contemplates that the optimization component can facilitate determining and/or selecting subsets of memory cells in virtually any manner that can maximize the number of memory cells in a sector that each can have two neighbor memory cells adjacent thereto that are also in the subset of memory cells.

By having a memory cell in the subset that has two neighbor memory cells in the subset, where the subset of memory cells can be erased at the same or substantially same time, can result in an improved erase of the memory cell. The electromagnetic field lines associated with the memory cell can be vertical or substantially vertical and undesirable fringing effects can be reduced or minimized. As a result, the erase speed associated with the memory cell can be improved, the erase saturation can be reduced, the erase window can be improved, etc., as compared to conventional erase techniques.

At 1106, the subset(s) of memory cells can be erased. In one aspect, an FN channel erase can be performed, and a predetermined voltage potential (e.g., −18 volt potential) can be applied to each memory cell of the subset of memory cells at the same or substantially the same time. If there is more than one subset, after the first subset of memory cells is erased, the next subset of memory cells can be erased, and so on, until all memory cells in the sector of the memory are erased. At this point, methodology 1100 can end.

Figure 12:
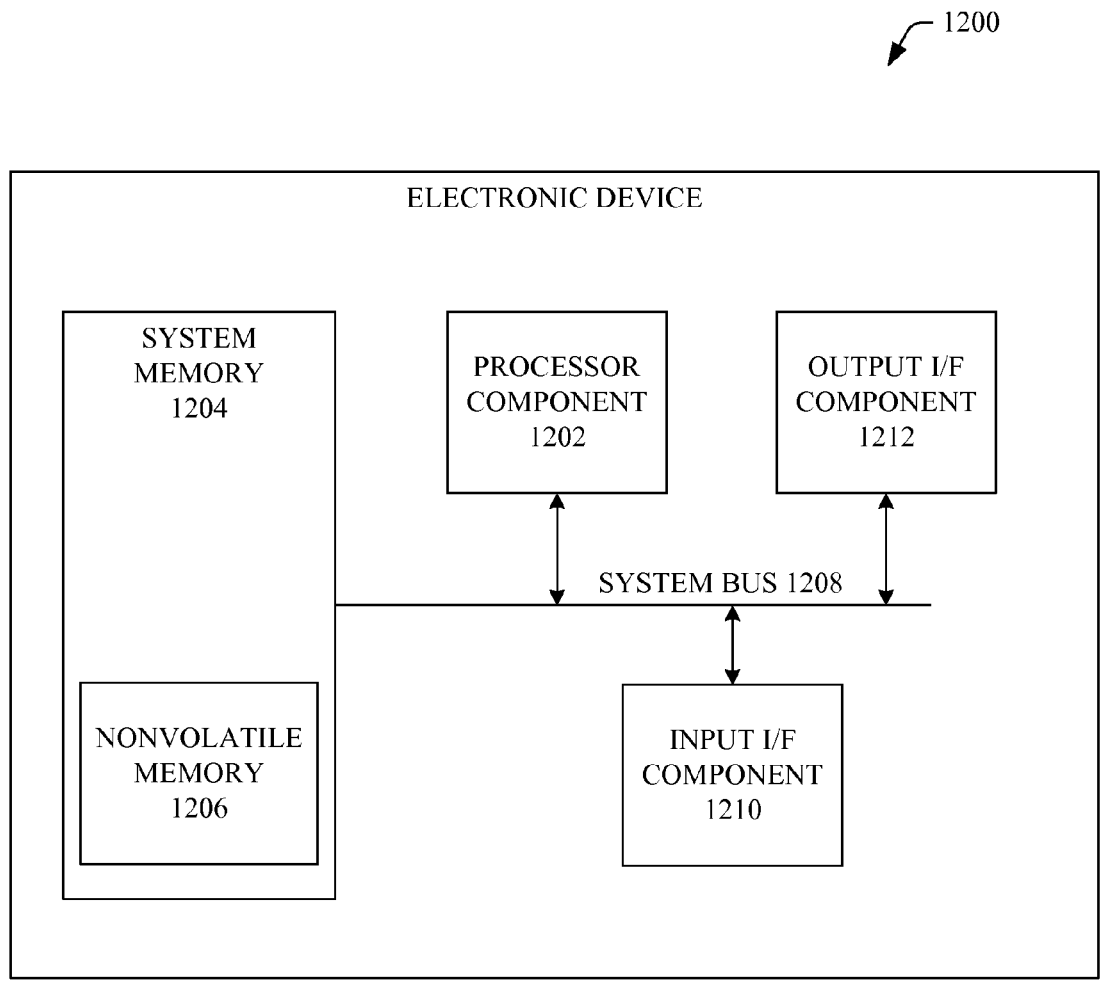
FIG. 12 illustrates a block diagram of an exemplary electronic device that can utilize a memory device(s) in accordance with an aspect of the disclosed subject matter.

Referring to FIG. 12, illustrated is a block diagram of an exemplary, non-limiting electronic device 1200 that can include a memory device that can store data in accordance with one aspect of the disclosed subject matter. The electronic device 1200 can include, but is not limited to, a computer, a laptop computer, network equipment (e.g. routers, access points), a media player and/or recorder (e.g., audio player and/or recorder, video player and/or recorder), a television, a smart card, a phone, a cellular phone, a smart phone, an electronic organizer, a PDA, a portable email reader, a digital camera, an electronic game (e.g., video game), an electronic device associated with digital rights management, a Personal Computer Memory Card International Association (PCM-CIA) card, a trusted platform module (TPM), a Hardware Security Module (HSM), set-top boxes, a digital video recorder, a gaming console, a navigation system (e.g., global position satellite (GPS) system), secure memory devices with computational capabilities, devices with tamper-resistant chips, an electronic device associated with an industrial control system, an embedded computer in a machine (e.g., an airplane, a copier, a motor vehicle, a microwave oven), and the like.

Components of the electronic device 1200 can include, but are not limited to, a processor component 1202, a system memory 1204 (with nonvolatile memory 1206), and a system bus 1208 that can couple various system components including the system memory 1204 to the processor component 1202. The system bus 1208 can be any of various types of bus structures including a memory bus or memory controller, a peripheral bus, or a local bus using any of a variety of bus architectures.

Electronic device 1200 can typically include a variety of computer readable media. Computer readable media can be any available media that can be accessed by the electronic device 1200. By way of example, and not limitation, computer readable media can comprise computer storage media and communication media. Computer storage media can include volatile and non-volatile, removable and non-removable media, that can be implemented in any method or technology for storage of information, such as computer readable instructions, data structures, program modules or other data. Computer storage media includes, but is not limited to, RAM, ROM, EEPROM, nonvolatile memory 1206 (e.g., flash memory), or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by electronic device 1200. Communication media typically can embody computer readable instructions, data structures, program modules or other data in a modulated data signal such as a carrier wave or other transport mechanism and includes any information delivery media.

The system memory 1204 can include computer storage media in the form of volatile and/or nonvolatile memory 1206 (e.g., memory device 100, memory device 300, memory device 400, etc.). A basic input/output system (BIOS), containing the basic routines that help to transfer information between elements within electronic device 1200, such as during start-up, can be stored in memory 1204. Memory 1204 can typically contain data and/or program modules that can be immediately accessible to and/or presently be operated on by processor component 1202. By way of example, and not limitation, system memory 1204 can also include an operating system, application programs, other program modules, and program data.

The nonvolatile memory 1206 can be removable or non-removable. For example, the nonvolatile memory 1206 can be in the form of a removable memory card or a USB flash drive. In accordance with one aspect, the nonvolatile memory 1206 can include flash memory (e.g., single-bit flash memory, multi-bit flash memory), ROM, PROM, EPROM, EEPROM, or NVRAM (e.g., FeRAM), or a combination thereof, for example. Further, the flash memory can be comprised of NOR flash memory and/or NAND flash memory.

A user can enter commands and information into the electronic device 1200 through input devices (not shown) such as a keypad, microphone, tablet or touch screen although other input devices can also be utilized. These and other input devices can be connected to the processor component 1202 through input interface component 1210 that can be connected to the system bus 1208. Other interface and bus structures, such as a parallel port, game port or a universal serial bus (USB) can also be utilized. A graphics subsystem (not shown) can also be connected to the system bus 1208. A display device (not shown) can be also connected to the system bus 1208 via an interface, such as output interface component 1212, which can in turn communicate with video memory. In addition to a display, the electronic device 1200 can also include other peripheral output devices such as speakers (not shown), which can be connected through output interface component 1212.

Artificial intelligence based systems (e.g., explicitly and/or implicitly trained classifiers) can be employed in connection with performing inference and/or probabilistic determinations and/or statistical-based determinations as in accordance with one or more aspects of the disclosed subject matter as described herein. As used herein, the term "inference," "infer" or variations in form thereof refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the disclosed subject matter.

For example, an artificial intelligence based system can render an evaluate current or historical evidence associated with erase operations executed or being executed on a memory device, and based in part in such evaluation, can render an inference, based in part on probability, regarding, for instance, a number of memory cells that can be included in a subset of memory cells to be erased at the same or substantially the same time, the memory cells of a sector that can be included in the subset of memory cells, a number of memory cells adjacent to a particular memory cell, etc.

The aforementioned systems have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

Furthermore, the disclosed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., CD, DVD . . . ), smart cards, and flash memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the disclosed subject matter.

Moreover, the word "exemplary" is used herein to mean serving as an example, instance, or illustration. Any aspect or design described herein as "exemplary" is not necessarily to be construed as preferred or advantageous over other aspects or designs.

Some portions of the detailed description have been presented in terms of algorithms and/or symbolic representations of operations on data bits within a computer memory. These algorithmic descriptions and/or representations are the means employed by those cognizant in the art to most effectively convey the substance of their work to others equally skilled. An algorithm is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the foregoing discussion, it is appreciated that throughout the disclosed subject matter, discussions utilizing terms such as processing, computing, calculating, determining, and/or displaying, and the like, refer to the action and processes of computer systems, and/or similar consumer and/or industrial electronic devices and/or machines, that manipulate and/or transform data represented as physical (electrical and/or electronic) quantities within the computer's and/or machine's registers and memories into other data similarly represented as physical quantities within the machine and/or computer system memories or registers or other such information storage, transmission and/or display devices.

What has been described above includes examples of the subject innovation. It is, of course, not possible to describe every conceivable combination of components or methodologies for purposes of describing the subject innovation, but one of ordinary skill in the art may recognize that many further combinations and permutations of the subject innovation are possible. Accordingly, the subject innovation is intended to embrace all such alterations, modifications, and variations that fall within the spirit and scope of the appended claims. Furthermore, to the extent that the term "contain," "includes," and "involves" are used in either the detailed description or the claims, such terms are intended to be inclusive in a manner similar to the term "comprising" as "comprising" is interpreted when employed as a transitional word in a claim.

What is claimed is:

1. A memory device, comprising:
    a subset of memory cells in a sector in the memory device, wherein each memory cell of the subset of memory cells is configured to store one or more bits of data therein; and
    an optimization component that facilitates selection of memory cells to be in the subset of memory cells based at least in part on a respective location of at least a first memory cell with respect to other memory cells in the sector to facilitate an erase of at least a portion of the memory cells, comprising the first memory cell, in the sector, the subset of memory cells comprising the first memory cell, a second memory cell and a third memory cell, the optimization component selects the first memory cell associated with a first word line for erase and facilitates application of an erase voltage to the first word line and thereby the first memory cell, and selects the second memory cell adjacent to the first memory cell and associated with a second word line adjacent to the first word line, and selects the third memory cell adjacent to the first memory cell and associated with a third word line adjacent to the first word line, wherein a specified voltage is applied to the second word line and the third word line to facilitate application of a voltage bias corresponding to the erase voltage to the second memory cell and the third memory cell substantially simultaneously with the application of the voltage to the first memory cell to facilitate reduction in fringing effect associated with the first memory cell during the erase.

2. The memory device of claim 1, the optimization component selects the subset of memory cells such that a memory cell in the subset has two other memory cells adjacent thereto that are in the subset, or the memory cell in the subset has one other memory cell adjacent thereto if the memory cell is at the end of a row of memory cells in a memory array in the memory device.

3. The memory device of claim 1, further comprising a memory controller that facilitates application of the erase voltage to at least the first memory cell and the specified voltage to at least the second memory cell and the third memory cell of the subset of memory cells to facilitate an erase of at least the first memory cell.

4. The memory device of claim 1, the memory device is a flash memory comprising a plurality of memory cells including the subset of memory cells, wherein at least one of the first memory cell, the second memory cell or the third memory cell includes at least one charge storage component that comprises a top oxygen layer, a top silicon-rich silicon nitride layer, a polysilicon layer, a bottom silicon-rich silicon nitride layer, and a bottom oxygen layer.

5. The memory device of claim 4, wherein at least one of the first memory cell, the second memory cell or the third memory cell further comprises a gate component that is a gate electrode comprising at least one of a layer of N+ type polysilicon material or a layer of P+ type polysilicon material.

6. The memory device of claim 5, the optimization component employs a Fowler-Nordheim channel erase to facilitate erasure of at least the first memory cell of the subset of memory cells.

7. The memory device of claim 6, further comprising a substrate, the optimization component facilitates application of a predetermined negative voltage bias to a respective gate electrode of at least the second memory cell and the third memory cell of the subset of memory cells and a predetermined positive voltage bias to the substrate to generate a current and electromagnetic fields in at least the second memory cell and the third memory cell in the subset of memory cells to facilitate the erase of at least the first memory cell in the subset of memory cells, wherein amount of the voltage bias corresponds to amount of the predetermined negative voltage and amount of the predetermined positive voltage.

8. The memory device of claim 1, the optimization component evaluates the respective locations of at least the first memory cell in the sector that is to be erased and at least two other memory cells in the sector, comprising the second memory cell and third memory cell, to facilitate selection of the subset of memory cells such that a maximum number of memory cells to be erased in the sector each have two memory cells that are adjacent thereto.

9. The memory device of claim 1, the optimization component selects the subset of memory cells such that, during the erase of the at least a portion of the memory cells, a maximum number of memory cells in the sector selected for erase each have two memory cells adjacent to such memory cell wherein the two memory are in the subset of memory cells.

10. The memory device of claim 1, the optimization component selects the subset of memory cells based at least in part to facilitate reduction in a fringe effect associated with electromagnetic fields during the erase of at least the first memory cell of the subset of memory cells such that the electromagnetic fields associated with the at least first memory cell are substantially vertical with respect to at least the first memory cell during erase of at least the first memory cell.

11. The memory device of claim 1, the memory device is a nonvolatile memory device comprising at least one of a flash memory, a mask-programmed read only memory, programmable read only memory, erasable read only memory, Ultra Violet (UV)-erase erasable read only memory, one-time programmable read only memory, electrically erasable programmable read only memory, or nonvolatile random access memory, or a combination thereof.

12. An electronic device comprising the memory device of claim 1.

13. The electronic device of claim 12, wherein the electronic device comprises at least one of a computer, a laptop computer, network equipment, a media player, a media recorder, a television, a smart card, a phone, a cellular phone, a smart phone, an electronic organizer, a personal digital assistant, a portable email reader, a digital camera, an electronic game, an electronic device associated with digital rights management, a Personal Computer Memory Card International Association (PCMCIA) card, a trusted platform module (TPM), a Hardware Security Module (HSM), set-top boxes, a digital video recorder, a gaming console, a navigation system, a secure memory device with computational capabilities, a device with at least one tamper-resistant chip, an electronic device associated with industrial control systems, or an embedded computer in a machine, or a combination thereof, wherein the machine comprises one of an airplane, a copier, a motor vehicle, or a microwave oven.

* * * * *